US012216869B2

(12) United States Patent
Qu et al.

(10) Patent No.: US 12,216,869 B2
(45) Date of Patent: Feb. 4, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yi Qu, Beijing (CN); Zhiwen Chu, Beijing (CN); Yang Zhou, Beijing (CN); Lu Bai, Beijing (CN); Junxiu Dai, Beijing (CN); Xinxin Wang, Beijing (CN); Yi Zhang, Beijing (CN); Shun Zhang, Beijing (CN); Xin Chen, Beijing (CN); Yu Wang, Beijing (CN); Ping Wen, Beijing (CN); Yuanqi Zhang, Beijing (CN); Wei Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/261,895

(22) PCT Filed: Aug. 29, 2022

(86) PCT No.: PCT/CN2022/115533
§ 371 (c)(1),
(2) Date: Jul. 18, 2023

(87) PCT Pub. No.: WO2024/044893
PCT Pub. Date: Mar. 7, 2024

(65) Prior Publication Data
US 2024/0393907 A1 Nov. 28, 2024

(51) Int. Cl.
*G06F 3/044* (2006.01)
*G06F 3/041* (2006.01)

(52) U.S. Cl.
CPC .......... *G06F 3/0443* (2019.05); *G06F 3/0412* (2013.01); *G06F 3/04164* (2019.05); *G06F 2203/04107* (2013.01)

(58) Field of Classification Search
CPC ........ G06F 3/044–0448; G06F 3/0416–04186; G06F 3/04164; G06F 3/0412; G06F 2203/04107
See application file for complete search history.

(56) References Cited

U.S. PATENT DOCUMENTS 9,140,738 B2 * 9/2015 Shimizu ................ G06F 3/0443
11,061,498 B2 * 7/2021 Park .................... H10K 59/8731
(Continued)

FOREIGN PATENT DOCUMENTS

CN 102541334 B 9/2016
CN 110928453 A 3/2020
(Continued)

*Primary Examiner* — Patrick F Marinelli
(74) *Attorney, Agent, or Firm* — MUNCY, GEISSLER, OLDS & LOWE, P.C.

(57) ABSTRACT

Provided are a display panel and a display device. An isolation dam is provided in a peripheral area of the display panel. The display panel includes: a display functional layer comprising a plurality of display signal traces; and a touch-control functional layer comprising a plurality of touch-control signal traces. On the binding side, there are a first boundary and a second boundary, and a first trace area located between the first boundary and the second boundary, the first boundary is closer to the display area than the second boundary. In the first trace area, the touch-control signal trace is arranged along a first direction and are led out from the binding circuit and connected to the touch-control pattern via the isolation dam and the first trace area in (Continued)

sequence, the display signal trace is arranged along a second direction and intersects with the touch signal trace.

19 Claims, 11 Drawing Sheets

(56) References Cited

U.S. PATENT DOCUMENTS

| | | | | |
|---|---|---|---|---|
| 11,494,016 | B2* | 11/2022 | Tang | G06F 3/0443 |
| 11,907,468 | B2* | 2/2024 | Kuo | G06F 3/0443 |
| 11,937,485 | B2* | 3/2024 | Zhao | H10K 59/40 |
| 12,041,814 | B2* | 7/2024 | Zhao | G06F 3/0446 |
| 2008/0137016 | A1* | 6/2008 | Kim | G02F 1/13452 326/82 |
| 2011/0080376 | A1* | 4/2011 | Kuo | G06F 3/0412 345/173 |
| 2013/0321003 | A1* | 12/2013 | Shimizu | G06F 3/0443 324/663 |
| 2016/0147325 | A1* | 5/2016 | Tai | G06F 3/04164 345/173 |
| 2018/0095571 | A1* | 4/2018 | Park | G06F 3/0412 |
| 2020/0091252 | A1* | 3/2020 | Bang | H10K 50/82 |
| 2020/0110497 | A1* | 4/2020 | Jin | G06F 3/0446 |
| 2021/0074771 | A1 | 3/2021 | Jiang et al. | |
| 2021/0191548 | A1 | 6/2021 | Huang et al. | |
| 2021/0278920 | A1* | 9/2021 | Tang | H10K 59/126 |
| 2022/0029137 | A1* | 1/2022 | Ko | G06F 3/0445 |
| 2022/0102689 | A1* | 3/2022 | Jiang | H10K 50/844 |
| 2022/0415971 | A1* | 12/2022 | Zhao | H10K 59/40 |
| 2023/0097832 | A1* | 3/2023 | Kuo | G06F 3/0446 345/173 |
| 2023/0101823 | A1* | 3/2023 | Zhao | G06F 3/0412 345/174 |
| 2023/0200154 | A1* | 6/2023 | Bang | H10K 59/131 257/40 |
| 2024/0004488 | A1* | 1/2024 | Jung | G06F 3/0446 |
| 2024/0172519 | A1* | 5/2024 | Zhao | H10K 59/40 |
| 2024/0206271 | A1* | 6/2024 | Zhang | H10K 71/00 |
| 2024/0295932 | A1* | 9/2024 | Yan | G02F 1/1333 |

FOREIGN PATENT DOCUMENTS

| | | |
|---|---|---|
| CN | 112612371 A | 4/2021 |
| CN | 112711347 A | 4/2021 |
| CN | 113296624 A | 8/2021 |
| CN | 113672129 A | 11/2021 |
| CN | 114594876 A | 6/2022 |
| CN | 114725176 A | 7/2022 |
| WO | 2020043079 A1 | 3/2020 |

\* cited by examiner

DISPLAY PANEL AND DISPLAY DEVICE

CROSS-REFERENCE TO RELATED APPLICATIONS

This application is the U.S. national phase of PCT Application No. PCT/CN2022/115533 filed on Aug. 29, 2022, the entire contents of which are hereby incorporated by reference.

TECHNICAL FIELD

The present disclosure relates to the field of display technology, and more particularly, to a display panel and a display device.

BACKGROUND

OLED (Organic Light Emitting Diode) display devices have become a competitive and promising class of display devices due to a series of advantages, such as all-solid-state structure, self-luminescence, fast response, high brightness, full viewing angle, and flexible display. In the related art, a flexible OLED product may integrate a touch-control functional layer onto a display panel. Higher requirements are placed on operational stability and reliability in OLED products.

SUMMARY

Embodiments of the present disclosure provide a display panel and a display device, which may improve operational stability and reliability of a display product.

The technical solutions provided by the embodiments of the present disclosure are as follows.

In a first aspect, an embodiment of the present disclosure provides a display panel, which includes a display area and a peripheral area located at the periphery of the display area. At least one side of the peripheral area is a binding side connected with a binding circuit, and the peripheral area is provided with an isolation dam arranged at least partially around the display area:

the display panel includes:
a substrate;
a display functional layer, where the display functional layer includes display units located in the display area, and a plurality of display signal traces that are located in at least part of the peripheral area and are connected with the display units; and
a touch-control functional layer, where the touch-control functional layer includes a touch-control pattern located in the display area, and a plurality of touch-control signal traces located in at least part of the peripheral area, and the touch-control signal trace and the display signal trace are arranged in different layers;
where on the binding side, there are a first boundary and a second boundary arranged opposite to each other, and a first trace area located between the first boundary and the second boundary, and the first boundary is closer to the display area than the second boundary;
in the first trace area, the touch-control signal trace is arranged along a first direction and are led out from the binding circuit and connected to the touch-control pattern via the isolation dam and the first trace area in sequence, the display signal trace is arranged along a second direction intersecting with the first direction, and there is an intersection area between orthographic projections of the display signal trace and the touch-control signal trace onto the substrate;
where the display panel further includes a signal shielding layer between the touch-control signal traces and the display signal traces in a direction perpendicular to the substrate, and an orthographic projection of the signal shielding layer onto the substrate at least partially covers the intersection area of the touch-control signal trace and the display signal trace within the first trace area.

Illustratively, an opening pattern is provided on the signal shielding layer, and an orthographic projection of the touch-control signal trace onto the substrate at least partially does not coincide with an orthographic projection of the opening pattern onto the substrate.

Illustratively, an orthographic projection of the touch-control signal trace along the first direction onto the substrate does not coincide with the orthographic projection of the opening pattern onto the substrate.

Illustratively, the opening pattern includes a plurality of apertures, and at least one of the apertures is provided at a gap between at least two adjacent touch-control signal traces.

Illustratively, the display units include an anode layer, an organic electroluminescent layer and a cathode layer, where the anode layer includes an anode pattern for accessing a display signal, the signal shielding layer is arranged in a same layer and made of a same material as the anode pattern, the signal shielding layer is not connected to the anode pattern, and the signal shielding layer is configured to access a constant-low direct current signal or a constant-high direct current signal.

Illustratively, the display panel further includes: a cathode lapping pattern that is arranged on the same layer and made of the same material as the anode pattern, where an orthographic projection of the cathode lapping pattern onto the substrate do not coincide with an orthographic projection of the anode pattern onto the substrate, the cathode lapping pattern and the anode pattern are insulated from each other, the orthographic projection of the cathode lapping pattern onto the substrate at least partially coincides with an orthographic projection of the cathode layer onto the substrate, the cathode lapping pattern is electrically connected with the cathode layer, the cathode layer is inputted with the constant-low direct current signal, and the signal shielding layer and the cathode lapping pattern are connected as one body; and/or
the cathode layer is inputted with the constant-low direct current signal, an orthographic projection of a boundary of the cathode layer on a side near the isolation dam onto the substrate does not exceed the first boundary, the signal shielding layer has a first overlapping area on a side near the first boundary where the signal shielding layer overlaps with the cathode layer, and the first overlapping area is electrically connected to the cathode layer via a first via hole.

Illustratively, at least part of the cathode lapping pattern is located on the binding side, and is located in a transition corner area between the binding side and at least another side of the substrate that is adjacent to the binding side.

Illustratively, the display panel further includes an encapsulation layer configured to encapsulate the display functional layer, and the touch-control functional layer is directly arranged on a side of the encapsulation layer away from the substrate:
the touch-control functional layer is a touch-control structure on a flexible multi-layer screen, the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form the self-capacitance touch-control electrodes; or the touch-control functional layer is a touch-control structure on a flexible multi-layer screen, the touch-control pattern includes a plurality of mutual-capacitance touch-control electrodes distributed in an array, a film layer structure of the touch-control functional layer includes at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form the mutual-capacitance touch-control electrodes.

Illustratively, in the first direction, a plurality of peripheral source and drain metal traces are further provided between the second boundary and the display signal traces and/or between the second boundary and the binding circuit, the peripheral source and drain metal trace is inputted with a constant-low direct current signal or a constant-high direct current signal, the signal shielding layer has a second overlapping area on a side close to the second boundary where the signal shielding layer overlaps with the peripheral source and drain metal trace, and the second overlapping area is electrically connected to the peripheral source and drain metal trace via a second via hole.

Illustratively, the display units further include a first source and drain metal layer, and the first source and drain metal layer includes source electrode and drain electrode patterns of a thin-film transistor, where the peripheral source and drain metal traces are arranged in a same layer and made of a same material as the first source and drain metal layer.

Illustratively, the touch-control functional layer is a touch-control structure on a flexible multi-layer screen, the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form a self-capacitance touch-control electrode; or the touch-control functional layer is a touch-control structure on a flexible multi-layer screen, the touch-control pattern includes a plurality of mutual-capacitance touch-control electrodes distributed in an array, a film layer structure of the touch-control functional layer includes at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form a mutual-capacitance touch-control electrode; or the touch-control functional layer is a touch-control structure on a flexible single-layer screen, a film layer structure of the touch-control functional layer includes a touch-control electrode layer, and a touch-control pattern on the touch-control electrode layer includes a plurality of touch-control electrodes distributed in an array and touch-control signal traces connected to the plurality of touch-control electrodes.

Illustratively, at least a plurality of the touch-control signal traces are parallel to each other at a first position where the touch-control signal traces are led out from the binding circuit and a line spacing is a first spacing, and the touch-control signal traces are parallel to each other at a second position where the touch-control signal traces across the isolation dam and a line spacing is a second spacing, and the first spacing is smaller than the second spacing.

Illustratively, orthographic projections of the at least a plurality of the touch-control signal traces onto the substrate are led out in parallel from the first position, then are inclined at a same angle or at different angles to a second position in a same direction or in different directions, and finally extend in parallel from the second position.

Illustratively, the touch-control signal traces are divided into a plurality of sub-areas in the second direction, and a plurality touch-control signal traces in each of the sub-areas are symmetrically distributed with respect to a center being one of the touch-control signal traces in the middle in the second direction.

In a second aspect, an embodiment of the present disclosure provides a display panel, including a display area and a peripheral area located at the periphery of the display area, where at least one side of the peripheral area is a binding side connected with a binding circuit, and the peripheral area is provided with an isolation dam arranged at least partially around the display area:

the display panel includes:

a substrate;

a display functional layer, where the display functional layer includes display units located in the display area, and display signal traces that are located in at least part of the peripheral area and connected to the display units; and a touch-control functional layer, where the touch-control functional layer includes a touch-control pattern located in the display area, and touch-control signal traces located in at least part of the peripheral area, the touch-control signal trace and the display signal trace are arranged in different layers;

where on the binding side, the touch-control signal trace is arranged along a first direction, and is led out from the binding circuit and connected to the touch-control pattern via the isolation dam, at least a plurality of the touch-control signal traces are parallel to each other at a first position where the touch-control signal traces are led out from the binding circuit and a line spacing is a first spacing, and the touch-control signal traces are parallel to each other at a second position where the touch-control signal traces across the isolation dam and a line spacing is a second spacing, and the first spacing is smaller than the second spacing.

Illustratively, orthographic projections of the at least a plurality of the touch-control signal traces onto the substrate are led out in parallel from the first position, then are inclined at a same angle or at different angles to a second position in a same direction or in different directions, and finally extend in parallel from the second position.

Illustratively, the touch-control signal traces are divided into a plurality of sub-areas in the second direction, and a plurality touch-control signal traces in each of the sub-areas are symmetrically distributed with respect to a center being one of the touch-control signal traces in the middle in the second direction.

Illustratively, on the binding side, a boundary of a side of the display area close to the isolation dam is a first boundary, a boundary of a side of the isolation dam close to the display area is a second boundary, and there is a first trace area between the second boundary and the first boundary:

in the first trace area, the touch-control signal trace is arranged along a first direction and are led out from the binding circuit and connected to the touch-control pattern via the isolation dam and the first trace area in sequence, the display signal trace is arranged along a second direction intersecting with the first direction, and there is an intersection area between orthographic projections of the display signal trace and the touch-control signal trace onto the substrate;

where the display panel further includes a signal shielding layer between the touch-control signal traces and the display signal traces in a direction perpendicular to the substrate, and an orthographic projection of the signal shielding layer onto the substrate at least partially covers the intersection area of the touch-control signal trace and the display signal trace within the first trace area.

Illustratively, an opening pattern is provided on the signal shielding layer, and an orthographic projection of the touch-control signal trace onto the substrate at least partially does not coincide with an orthographic projection of the opening pattern onto the substrate.

Illustratively, at least one organic insulating layer is provided between the touch-control signal traces and the display signal traces in a direction perpendicular to the substrate, and the signal shielding layer is located between the organic insulating layer and the touch-control signal traces, or between the organic insulating layer and the display signal traces.

Illustratively, an orthographic projection of the touch-control signal trace along the first direction onto the substrate does not coincide with the orthographic projection of the opening pattern onto the substrate.

Illustratively, the opening pattern includes a plurality of apertures, and at least one of the apertures is provided at a gap between at least two adjacent touch-control signal traces.

Illustratively, the display units include an anode layer, an organic electroluminescent layer and a cathode layer, where the anode layer includes an anode pattern for accessing a display signal, the signal shielding layer is arranged in a same layer and made of a same material as the anode pattern, the signal shielding layer is not connected to the anode pattern, and the signal shielding layer is configured to access a constant-low direct current signal or a constant-high direct current signal.

Illustratively, the display panel further includes: a cathode lapping pattern that is arranged on the same layer and made of the same material as the anode pattern, where an orthographic projection of the cathode lapping pattern onto the substrate do not coincide with an orthographic projection of the anode pattern onto the substrate, the cathode lapping pattern and the anode pattern are insulated from each other, the orthographic projection of the cathode lapping pattern onto the substrate at least partially coincides with an orthographic projection of the cathode layer onto the substrate, the cathode lapping pattern is electrically connected with the cathode layer, the cathode layer is inputted with the constant-low direct current signal, and the signal shielding layer and the cathode lapping pattern are connected as one body; and/or the cathode layer is inputted with the constant-low direct current signal, an orthographic projection of a boundary of the cathode layer on a side near the isolation dam onto the substrate does not exceed the first boundary, the signal shielding layer has a first overlapping area on a side near the first boundary where the signal shielding layer overlaps with the cathode layer, and the first overlapping area is electrically connected to the cathode layer via a first via hole.

Illustratively, at least part of the cathode lapping pattern is located on the binding side, and is located in a transition corner area between the binding side and at least another side of the substrate that is adjacent to the binding side.

Illustratively, the display panel further includes an encapsulation layer configured to encapsulate the display functional layer, and the touch-control functional layer is directly arranged on a side of the encapsulation layer away from the substrate:

the touch-control functional layer is a touch-control structure on a flexible multi-layer screen, the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form the self-capacitance touch-control electrodes; or the touch-control functional layer is a touch-control structure on a flexible multi-layer screen, the touch-control pattern includes a plurality of mutual-capacitance touch-control electrodes distributed in an array, a film layer structure of the touch-control functional layer includes at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form the mutual-capacitance touch-control electrodes.

Illustratively, in the first direction, a plurality of peripheral source and drain metal traces are further provided between the second boundary and the display signal traces and/or between the second boundary and the binding circuit, the peripheral source and drain metal trace is inputted with a constant-low direct current signal or a constant-high direct current signal, the signal shielding layer has a second overlapping area on a side close to the second boundary where the signal shielding layer overlaps with the peripheral source and drain metal trace, and the second overlapping area is electrically connected to the peripheral source and drain metal trace via a second via hole.

Illustratively, the display units further include a first source and drain metal layer, and the first source and drain metal layer includes source electrode and drain electrode patterns of a thin-film transistor, where the peripheral source and drain metal traces are arranged in a same layer and made of a same material as the first source and drain metal layer.

Illustratively, the touch-control functional layer is a touch-control structure on a flexible multi-layer screen, the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form a self-capacitance touch-control electrode; or the touch-control functional layer is a touch-control structure on a flexible multi-layer screen, the touch-control pattern includes a plurality of mutual-capacitance touch-control electrodes distributed in an array, a film layer structure of the touch-control functional layer includes at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form a mutual-capacitance touch-control electrode; or the touch-control functional layer is a touch-control structure on a flexible single-layer screen, a film layer structure of the touch-control functional layer includes a touch-control electrode layer, and a touch-control pattern on the touch-control electrode layer includes a plurality of touch-control electrodes distributed in an array and touch-control signal traces connected to the plurality of touch-control electrodes.

The embodiments of the present disclosure have the beneficial effects as follows.

The display panel provided in some embodiments of the present disclosure can reduce the signal crosstalk between the touch signal trace and the display signal trace by adding a signal shielding layer between the touch signal trace and the display signal trace, thereby ensuring the touch function not to be adversely affected, which improves the working stability and reliability of a product. The display panel provided in some other embodiments of the present disclosure can reduce the short-circuit problem of the touch signal traces caused by the metal residue between the isolation dams by enlarging the line spacing of the touch signal trace at a position crossing the isolation dam. It can be seen that the display panel provided by the embodiment of the present disclosure can improve the working stability and reliability of the display product.

DETAILED DESCRIPTION

In order to make the objective, technical solutions and advantages of embodiments of the present disclosure clearer, a more particular description of the embodiments of the present disclosure will be rendered with reference to the appended drawings. It is to be understood that the described embodiments are part, but not all, of the embodiments of the present disclosure. Based on the embodiments described in the present disclosure, all other embodiments obtained by a person of ordinary skill in the art without inventive effort shall fall within the scope of the present disclosure.

Unless defined otherwise, technical or scientific terms used in the present disclosure shall have the ordinary meaning as understood by one of ordinary skill in the art to which this disclosure belongs. Such terms as "first", "second" used in the present disclosure does not denote any order, quantity, or importance, but rather is used to distinguish one element from another. Likewise, terms such as "a", "an", or "the" do not denote a limitation of quantity, but rather denote the presence of at least one of the referenced items. Such terms as "including" or "includes" means that the presence of an element or item preceding the word covers the presence of the element or item listed after the word and equivalents thereof, but does not exclude other elements or items. Such terms as "connected" or "connected" are not limited to physical or mechanical connections, but may include electrical connections, whether direct or indirect. Such terms as "upper", "lower", "left", "right" are used only to indicate relative positional relationships that may change accordingly when the absolute position of the object being described changes.

Before describing the display panel and the display device provided by the embodiments of the present disclosure in detail, it is necessary to describe the related art as follows.

In the relevant technologies, FMLOC (Flexible Multi-Layer On Cell) and FSLOC (Flexible Single-Layer On Cell) technologies form a touch circuit structure (namely, a touch-control functional layer) on an encapsulation layer 15 of an OLED display panel using a mask process, so as to integrate the touch-control functional layer on the display panel. The touch circuit structure may include a peripheral touch-control signal trace and a touch-control pattern in a touch area connected to the peripheral touch-control signal trace. The touch-control pattern may be a metal grid structure. The ways for the touch-control functional layer to realize its touch-control function are mainly in mutual-capacitance and self-capacitance manners.

Figure 1:
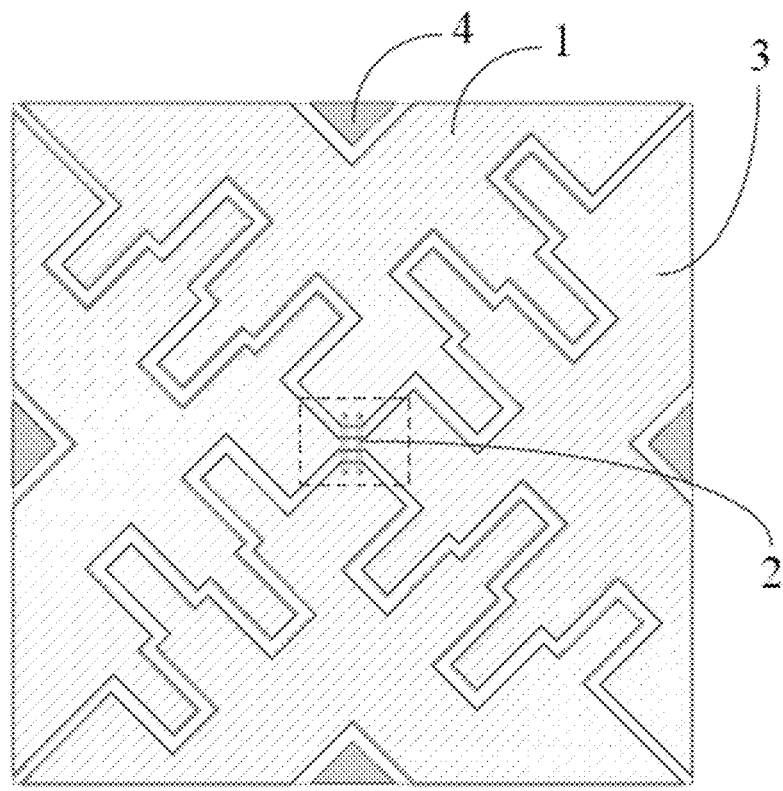
FIG. 1 is a partial structural diagram of a touch-control pattern of a touch-control functional layer in a display panel in the related art.
Figure 2:
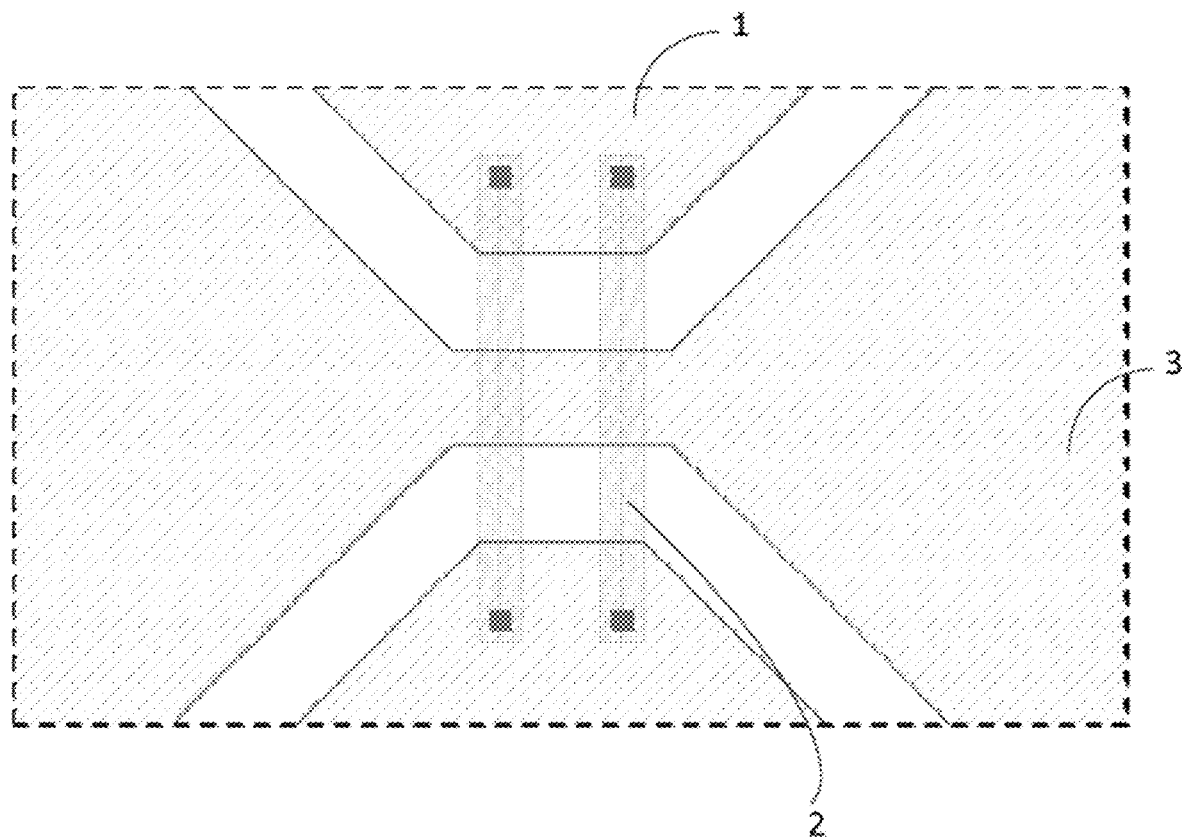
FIG. 2 is an enlarged partial view of the dashed box of FIG. 1.

Functionally, as shown in FIGS. 1 and 2, a touch-control pattern within a touch area may be divided into a signal transmitter (Tx) 1, a bridge 2, a signal receiver (Rx) 3, and a dummy area 4 without signal inputting. Viewed from the film layer, the touch-control functional layer may be divided into a first metal layer (TMB) and a second metal layer (TMA. The signal transmitter 1, the signal receiver 3 and the dummy area 4 may all be formed by the first metal layer (TMB), the bridge 2 may be formed by the second metal layer (TMA), and the bridge 2 connects the two parts of the signal transmitter or the signal receiver formed by the first metal layer a via hole in the insulating layer between the first metal layer and the second metal layer. In operation, a touch-control chip (Touch IC) makes a touch-control response based on a capacitance value Cm1 (no capacitance value before finger loading), Cm2 (a capacitance value after finger loading) and a variation ΔCm of the capacitance values between a signal transmitter and a signal receiver before and after finger loading.

Figure 3:
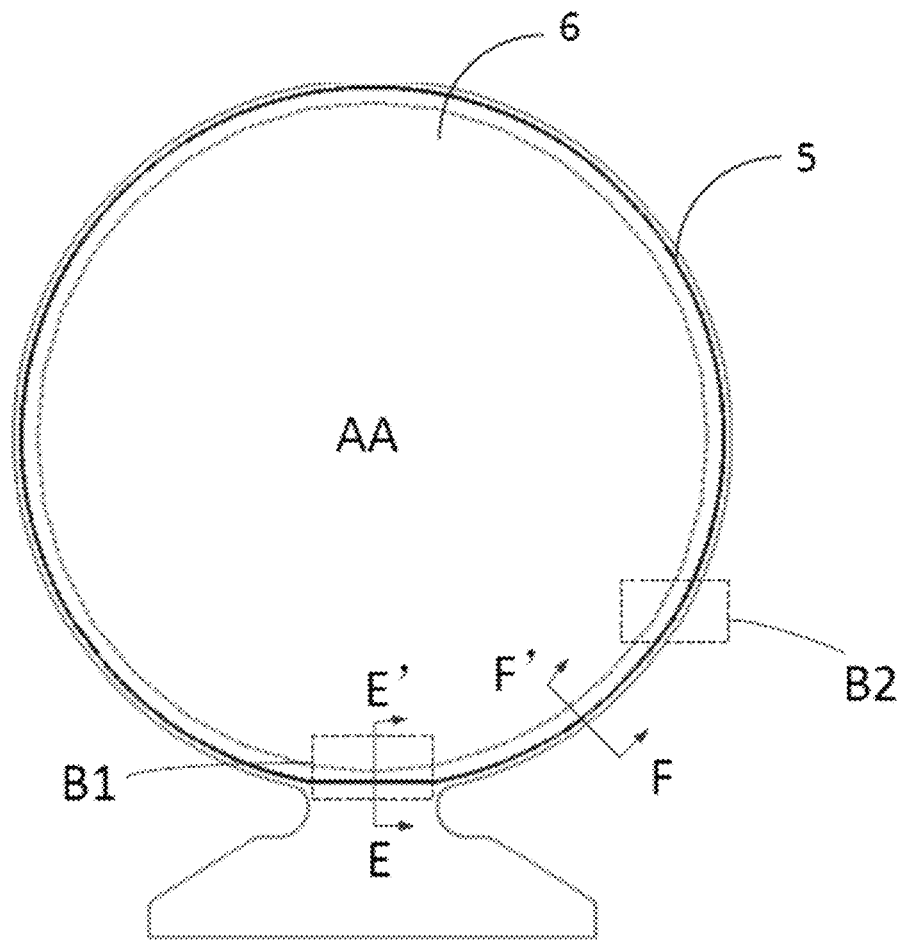
FIG. 3 is a simple schematic diagram showing an overall structure of a display panel in the related art.
Figure 4:
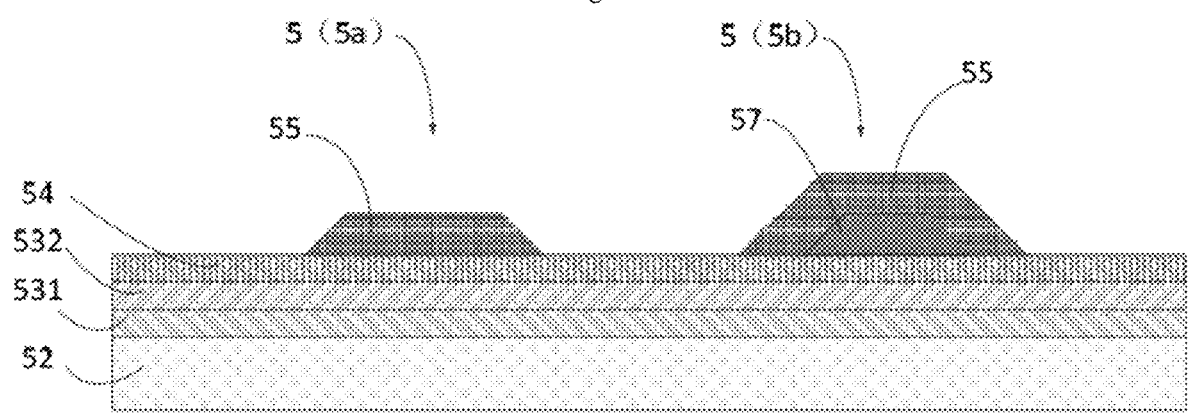
FIG. 4 is a cross-sectional view taken along a line E-E' in FIG. 3.

Viewed from the film layer, the stack structure of the OLED display panel may include: a substrate, a display functional layer located on the substrate, and an encapsulation layer 15 (IJP) encapsulating the display functional layer. The isolation dam 5 is a raised design that prevents the encapsulation layer 15 from overflowing. As shown in FIG. 3, the display panel 6 includes an effective display area (AA area) and a peripheral area located at the periphery of the effective display area, and the isolation dam 5 may be provided around the effective display area (AA area) in a circle. As shown in FIG. 4, the isolation dam 5 may be formed by an organic layer, and under the organic layer of the isolation dam 5, there may successively be a substrate 52, a gate insulating layer, an interlayer dielectric layer 54, etc. The substrate 51 may be in a multilayer structure including an organic layer and an inorganic layer, and the gate insulating layer may be one or more layers (for example, the gate insulating layer shown in FIG. 4 comprises a first gate insulating layer 531 and a second gate insulating layer 532), which may be an inorganic layer structure; the interlayer dielectric layer may be an inorganic layer structure 54.

Figure 5:
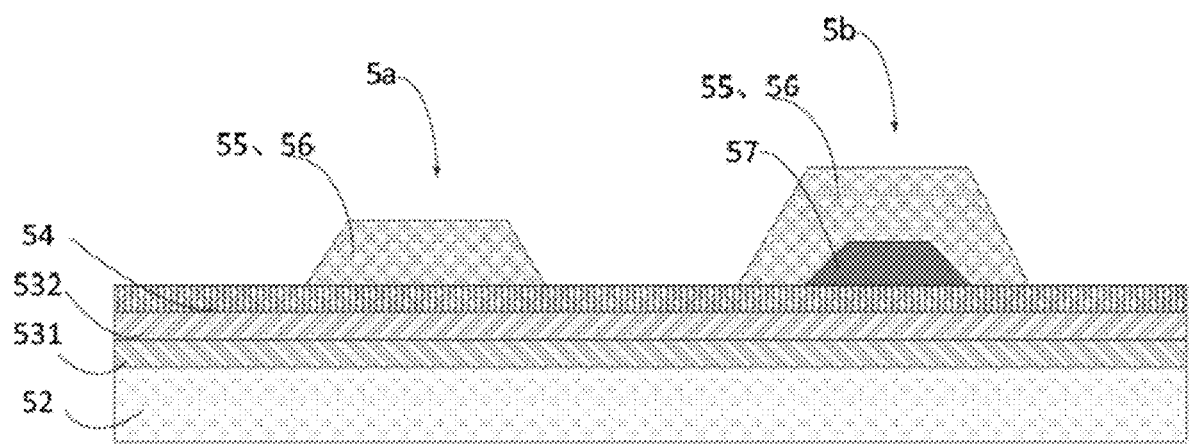
FIG. 5 is a cross-sectional view taken along a direction F-F' in FIG. 3.

The isolation dam 5 may be designed as a single isolation dam or a double isolation dam structure. As shown in FIGS. 3 and 4, the isolation dam is a double isolation dam structure. The isolation dam 5a in the inner ring may be referred to as Dam 1, and the isolation dam 5b in the outer ring may be referred to as Dam 2. In general, Dam 1 may be formed by using a pixel definition layer (PDL) 55 and a post spacer (PS) 56, and Dam 2 may be formed by using an organic insulating layer (PLN) 57, the pixel definition layer (PDL) 55 and the post spacer (PS) 56, so that Dam 2 may be higher than Dam 1. As shown in FIGS. 4 and 5, the isolation dam on the binding side may reduce the thickness of the pixel definition layer 55 and the post spacer 56, for example, as shown in FIGS. 4 and 5, the post spacer 56 is removed on the binding side due to the isolation dam 5, leaving only the pixel definition layer 55.

For FMLOC or FSLOC OLED products, it needs to avoid a cross-talk between the touch-control signal and the display signal, which affects the touch function. A variety of signal traces are usually arranged in a peripheral area of a display panel, especially in a binding side connected to a binding circuit, and the touch-control signal traces in the periphery need to be led out from the binding circuit and connected with a touch-control pattern across an isolation dam; therefore, signal crosstalk between the touch-control signal trace and the display signal trace needs to be avoided in the routing design of the traces at the binding side, so as to ensure the stability and reliability of the touch-control function.

The drawings are a partial layout diagram of a display panel on the binding side provided in some embodiments of the present disclosure.

Figure 7:
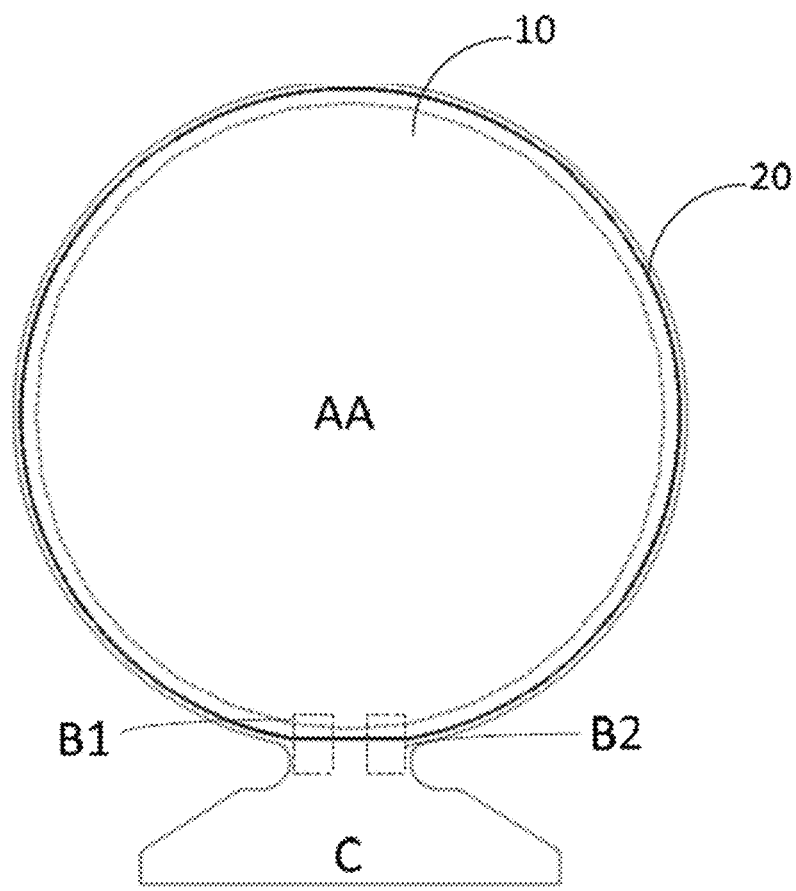
FIG. 7 is a front view of a display panel provided in an embodiment of the present disclosure.
Figure 8:
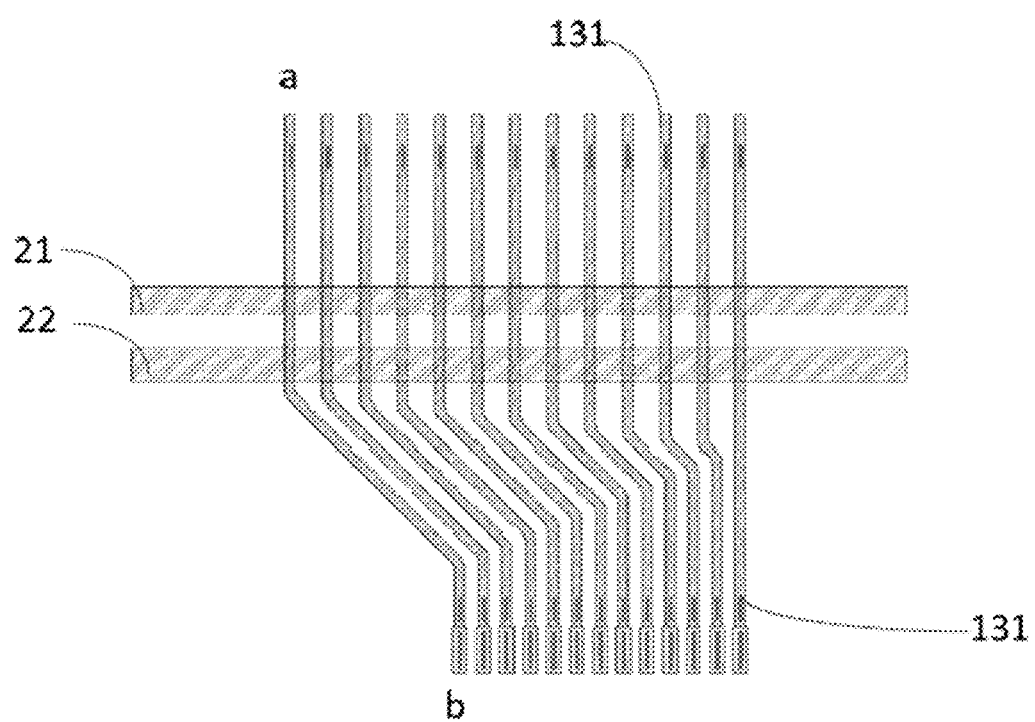
FIG. 8 is a schematic diagram of touch-control signal traces and an isolation dam structure at B1 in FIG. 7 according to some embodiments of the present disclosure.
Figure 9:
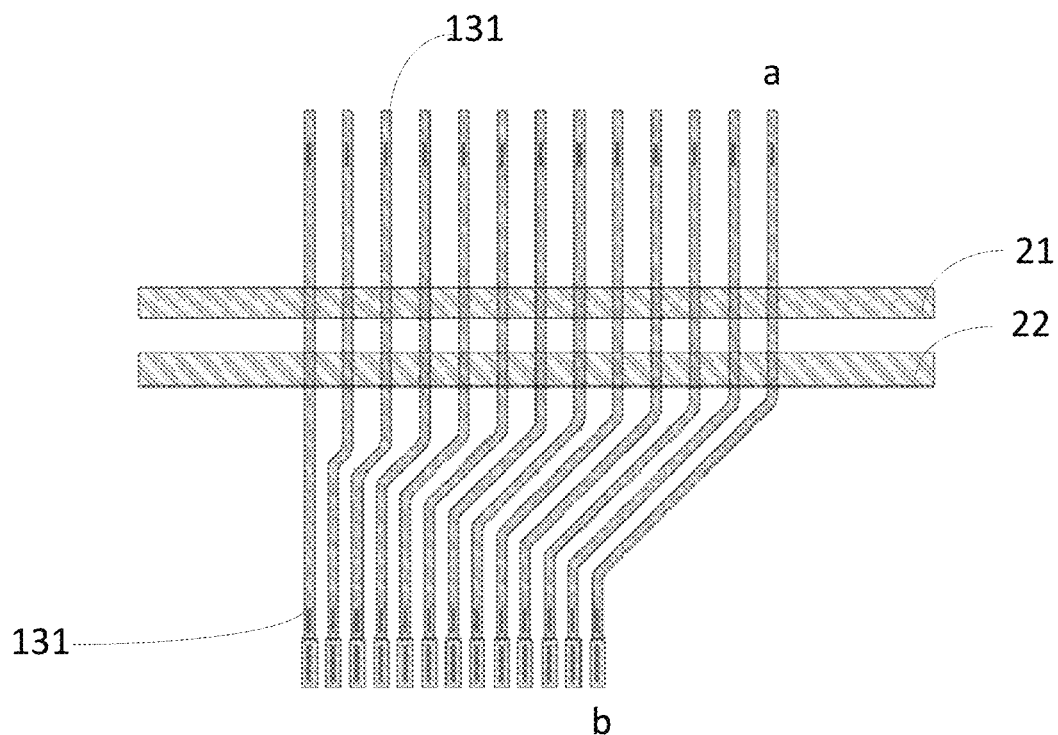
FIG. 9 is a schematic diagram of touch-control signal traces and an isolation dam structure at B2 in FIG. 7 according to some embodiments of the present disclosure.
Figure 10:
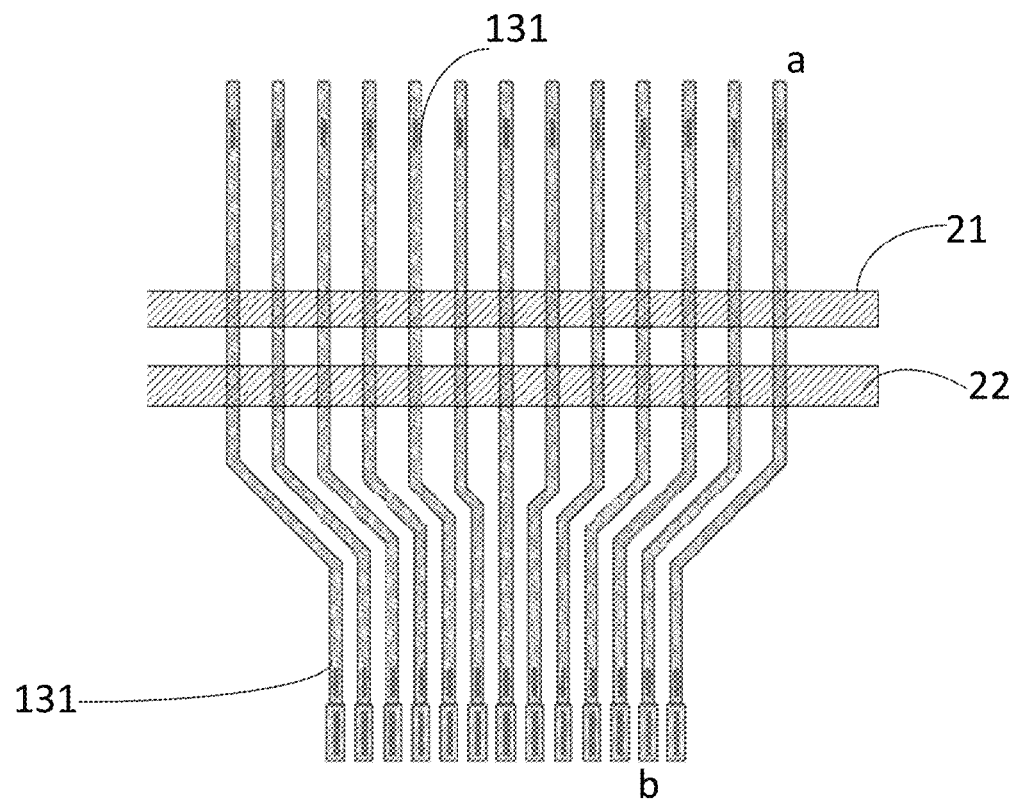
FIG. 10 is a schematic diagram showing the structure of touch-control signal traces and an isolation dam at B1 in FIG. 7 according to another embodiment of the present disclosure.
Figure 11:
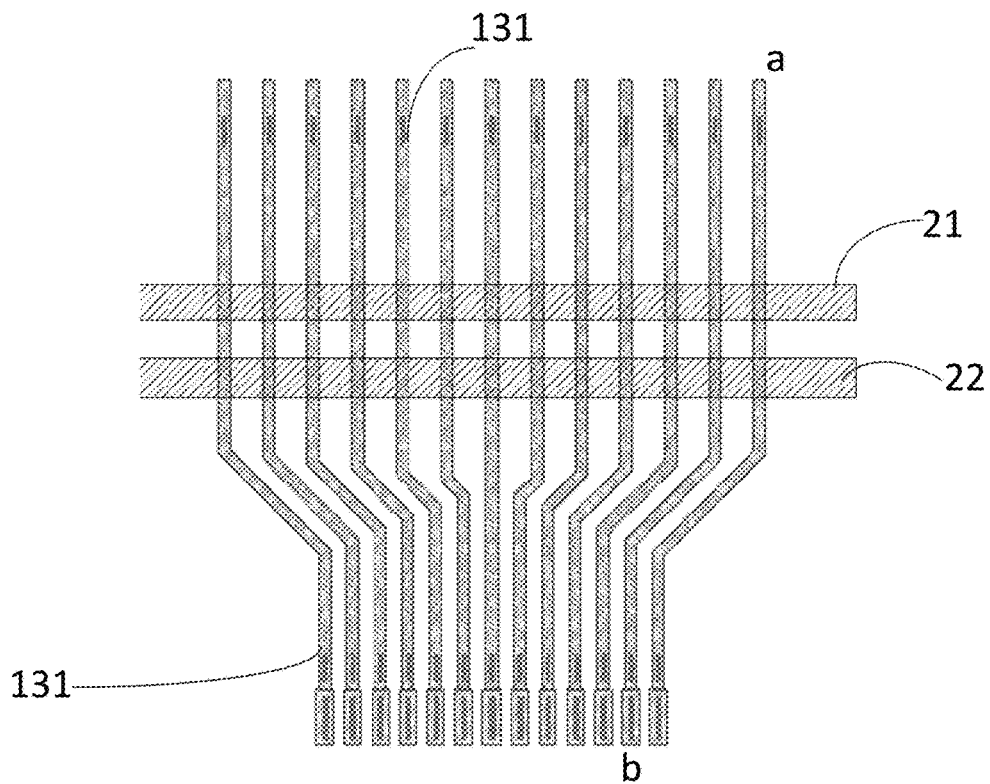
FIG. 11 is a schematic diagram showing the structure of touch-control signal traces and an isolation dam at B2 in FIG. 7 according to another embodiment of the present disclosure.
Figure 12:
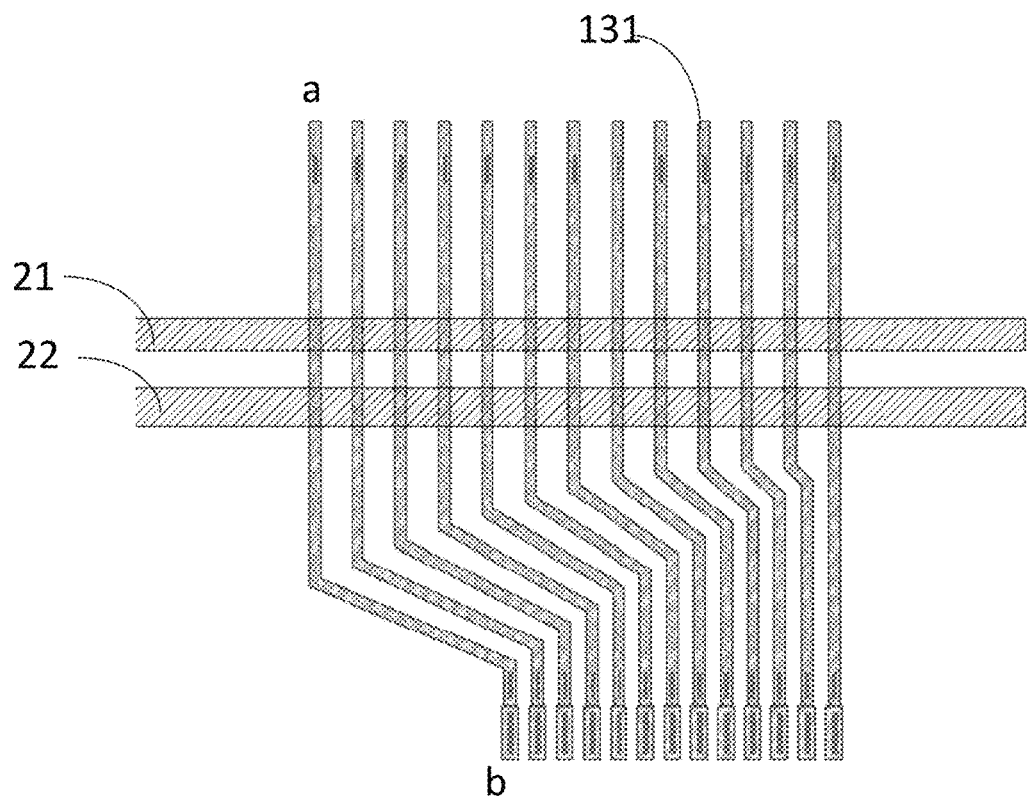
FIG. 12 is a schematic diagram showing the structure of touch-control signal traces and an isolation dam at B1 in FIG. 7 according to another embodiment of the present disclosure.
Figure 13:
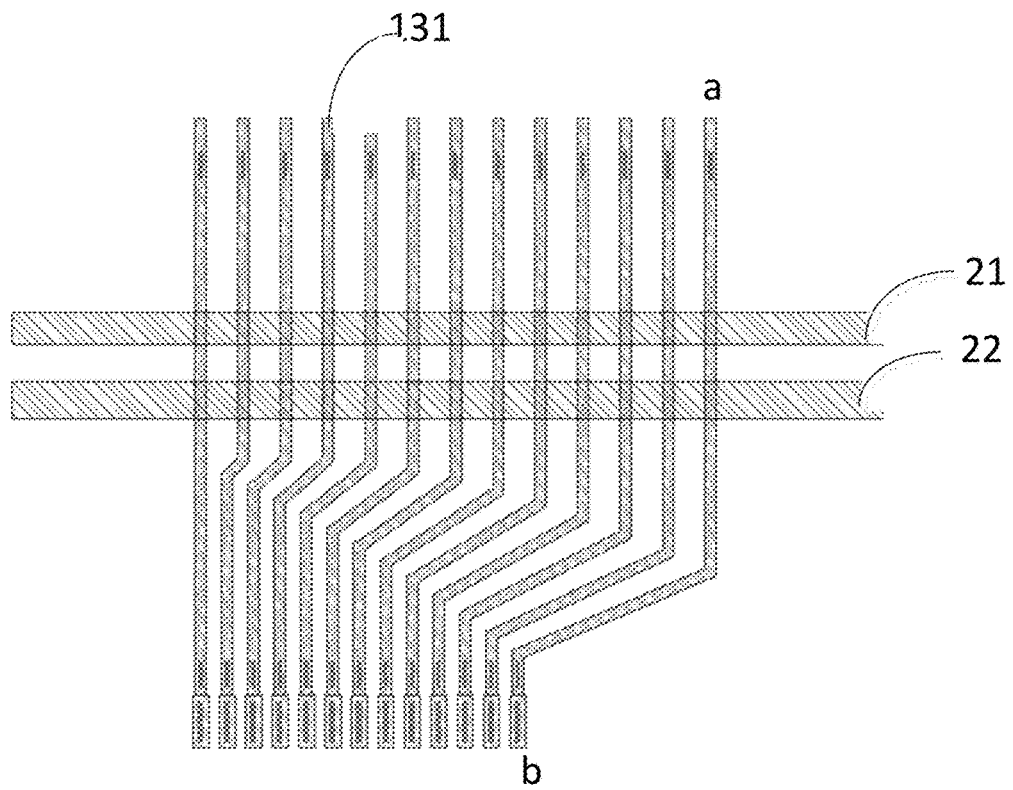
FIG. 13 is a schematic diagram showing the structure of touch-control signal traces and an isolation dam at B2 in FIG. 7 according to another embodiment of the present disclosure.
Figure 14:
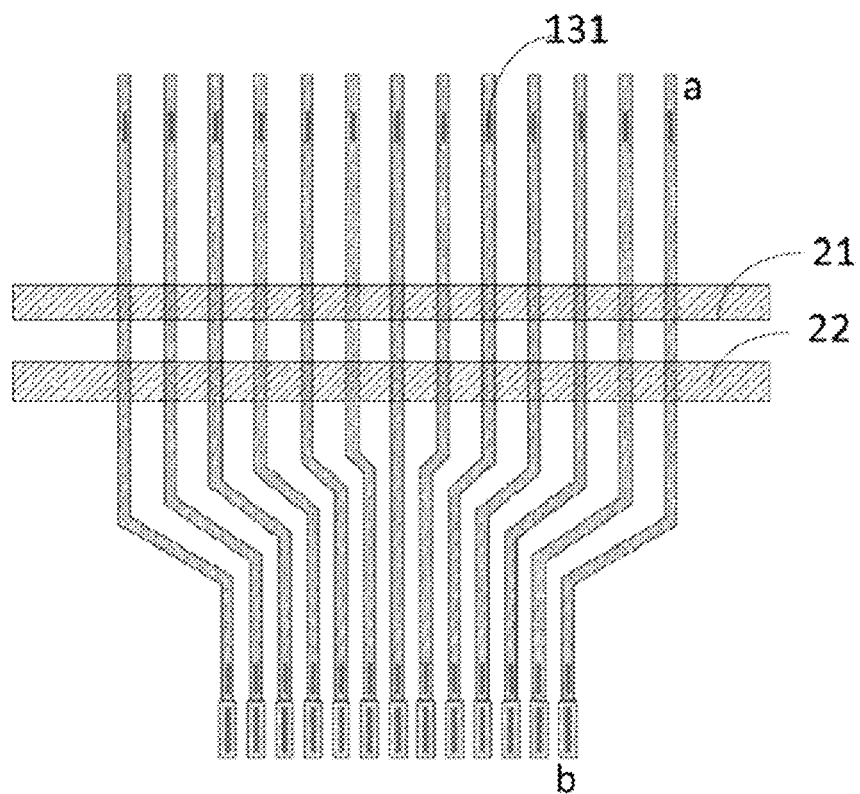
FIG. 14 is a schematic diagram showing the structure of touch-control signal traces and an isolation dam at B1 in FIG. 7 according to another embodiment of the present disclosure.
Figure 15:
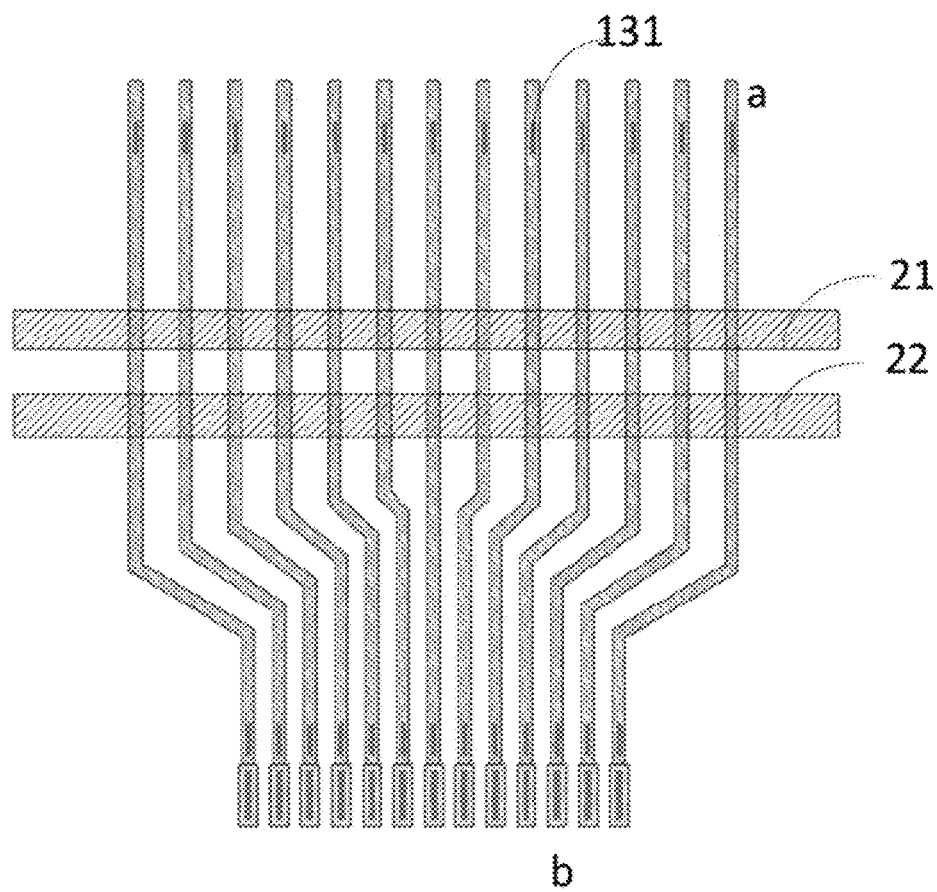
FIG. 15 is a schematic diagram showing the structure of touch-control signal traces and an isolation dam at B2 in FIG. 7 according to another embodiment of the present disclosure.

Referring to FIG. 7, some embodiments of the present disclosure provide a display panel 10 including a display area (AA area) and a peripheral area located at the periphery of the display area (AA area). At least one side of the peripheral area is a binding side having a binding area C at the binding side, a binding circuit is located within the binding area C, the peripheral area is provided with an isolation dam 20 disposed at least partially around the display area (AA area). In some embodiments, the isolation dam 20 includes an inner isolation dam 21 and an outer isolation dam 22.

Figure 22:
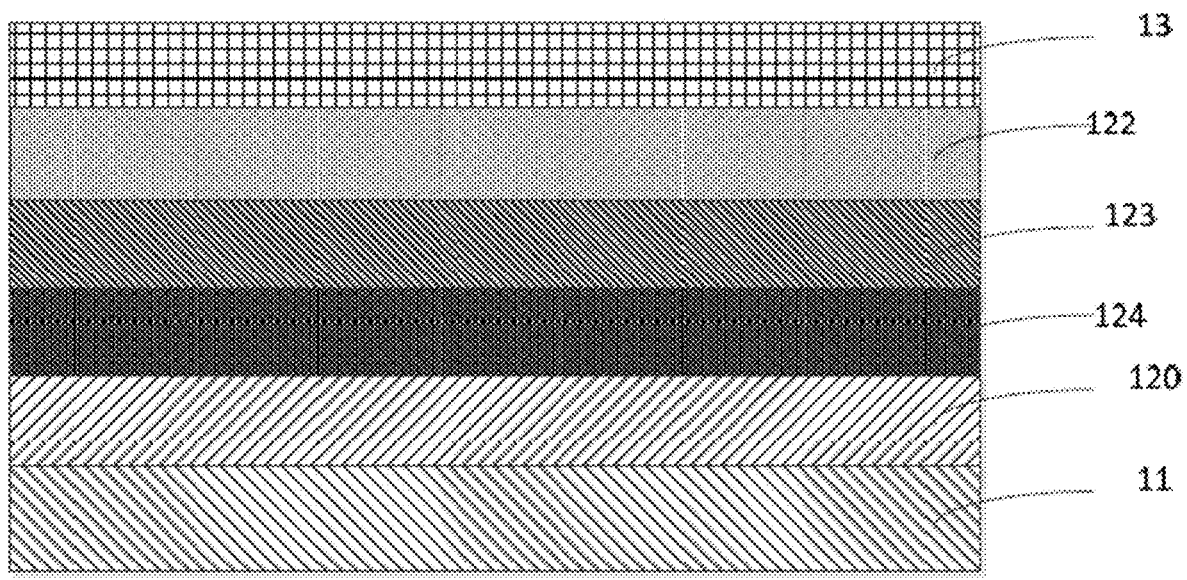
FIG. 22 is a schematic diagram of a film layer stack structure of a display panel provided by the present disclosure.

Referring to FIG. 22, the display panel 10 includes, as viewed from the film layer structure; a substrate 11, a display functional layer 12 and a touch-control functional layer 13.

The display functional layer 12 includes a display driving circuit layer 120, display units located in the display area (AA area), and a plurality of display signal traces connected to the display units. For example, taking the display panel 10 being an OLED display panel 10 as an example, the display unit may include a thin-film transistor, an anode layer 122, an organic electroluminescent layer 123 and a cathode layer 124, and the display signal trace 121 may include a peripheral display signal trace located in a peripheral area.

An encapsulation layer 15 is arranged on a side of the display functional layer 12 away from the substrate 11. The touch-control functional layer 13 is located on the encapsulation layer 15, and includes a touch-control pattern located in the display area (AA area), and a plurality of touch-control signal traces 131 at least partially located in the peripheral area.

The touch-control signal trace 131 and the display signal trace are arranged in different layers.

Figure 16:
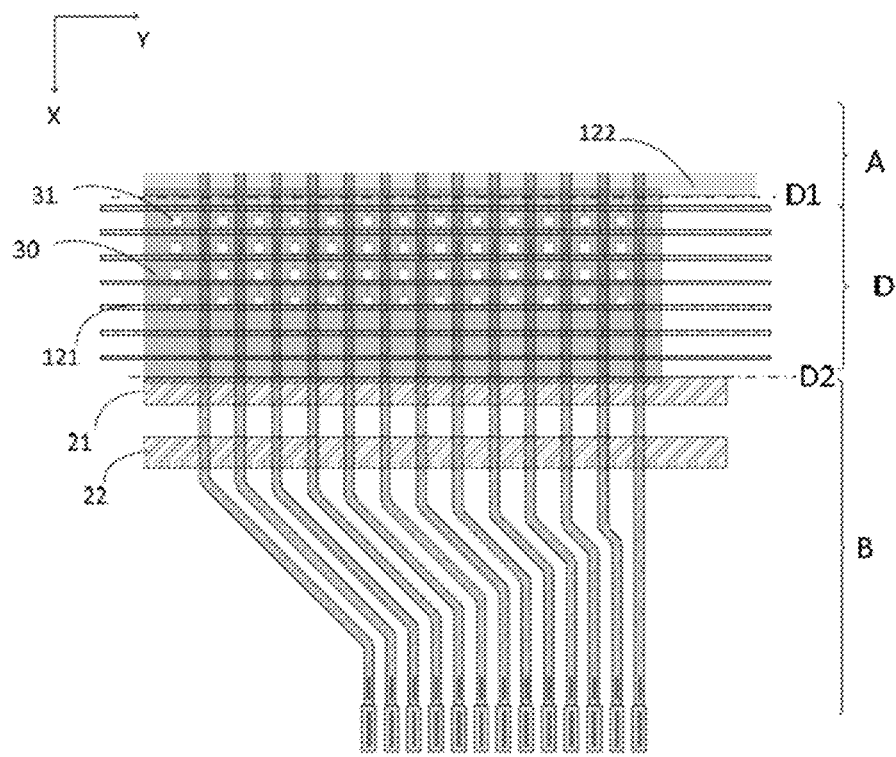
FIG. 16 is a schematic diagram showing the structure of touch-control signal traces and an isolation dam at B1 in FIG. 7 according to another embodiment of the present disclosure.

As shown in FIG. 16, on the binding side, there are a first boundary D1 and a second boundary D2 which are oppositely arranged, and a first trace area D is located between the first boundary D1 and the second boundary D2. The first boundary D1 is closer to the display area than the second boundary D2, that is to say, at the binding side, a boundary of a side of the display area (AA area) which is closer to the isolation dam 20 is the first boundary D1, and a boundary of one side of the isolation dam 20 which is closer to the display area (AA area) is the second boundary D2. There is a first trace area between the second boundary D2 and the first boundary D1. In the first trace area D, the touch-control signal trace 131 is arranged along a first direction X and led out from the binding circuit, and is connected to the touch-control pattern via the isolation dam 20 and the first trace area D in sequence, the display signal trace is arranged along a second direction Y intersecting the first direction X, and there is an intersection area between orthographic projections of the display signal trace and the touch-control signal trace 131 onto the substrate 11.

Figure 17:
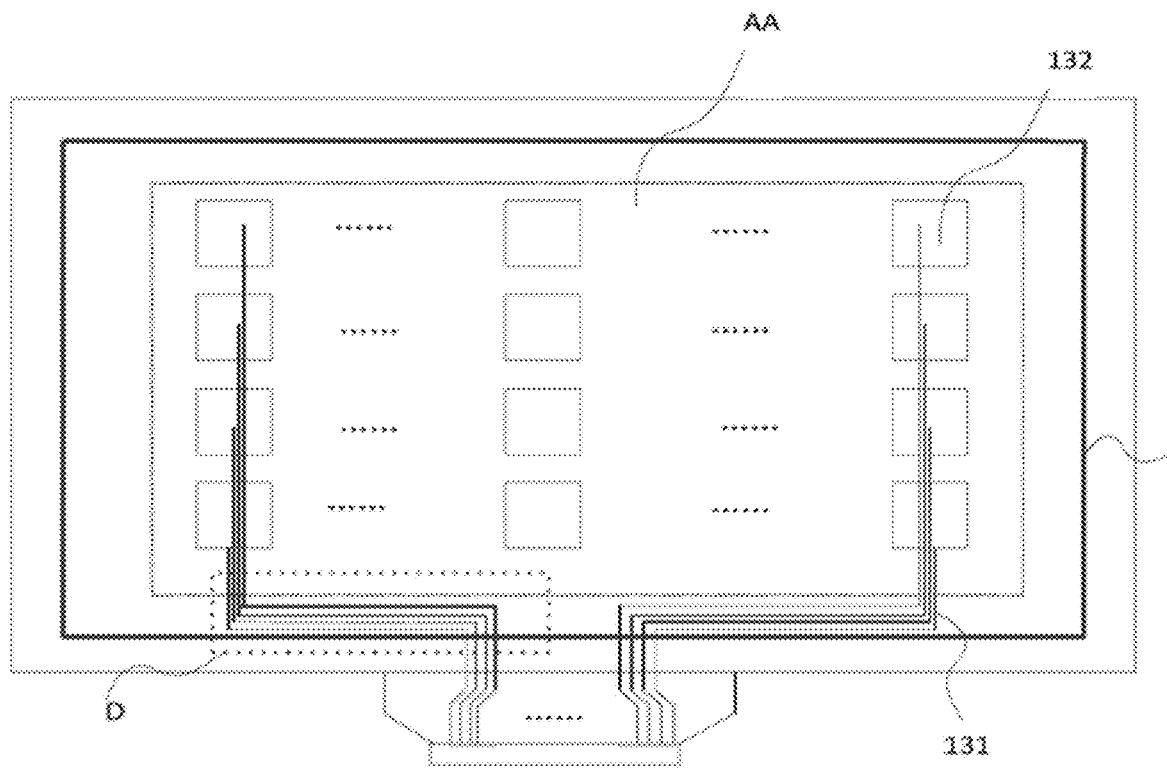
FIG. 17 is a schematic diagram of a touch-control structure of an FSLOC display panel in some embodiments of the present disclosure.

In order to explain the above solution more clearly, referring to FIG. 17, an example is given that the binding side of the display panel 10 is located at the lower frame of the display panel 10, after the peripheral touch-control signal traces 131 in the lower frame of the display panel 10 lead out from the binding circuit, the peripheral touch-control signal traces 131 cross the isolation dam 20 and extend into the display area (AA area), and then extend to the left or right frame directions respectively to access the touch-control pattern in the display area (AA area). The display area (AA area) of the display panel 10 includes a plurality of sub-pixels distributed in an array, where each sub-pixel may correspond to an anode, and the cathode layer 122 is generally designed to cover the whole display area (AA area). Taking the example shown in FIG. 17, the area from the upper boundary (namely; the second boundary D2) of the isolation dam 20 to the first boundary D1 (the first boundary D1 shown in the figure is the lower boundary of the cathode layer) of the display area (AA area) is the first trace area D, and the display signal traces 121 are also arranged in the first trace area D; the touch-control signal trace 131 may cross the display signal trace 121 in the first trace area D.

Figure 19:
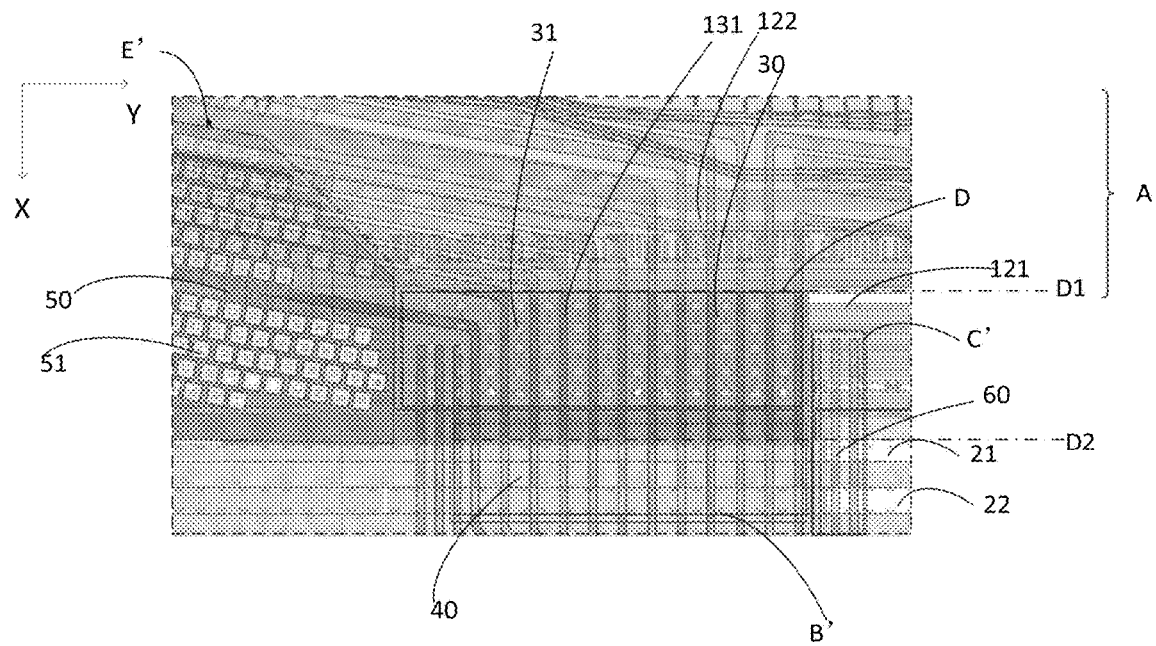
FIG. 19 is a schematic diagram of routing at B1 of FIG. 7 in further embodiments of the present disclosure.

The inventors have found that in the related art, in a display area (AA area) on a binding side, in an area where a touch-control signal trace 131 is connected with a touch-control pattern, namely, a first trace area D close to one side of the display area (AA area), as shown in the A area in FIG. 16 and FIG. 19, a signal crosstalk between the touch-control signal trace 131 and display signal trace may be well shielded, because a film layer such as a cathode layer 122 or an anode layer exists between the touch-control signal trace 131 and the display signal trace 121, and a constant-low direct current signal (VSS) or a constant-high direct current signal (VDD) is inputted into these film layers. Similarly, in a side of the first wiring area D away from the display area (AA area), i.e., the dashed box B area of FIG. 16 and the dashed box B' area shown in FIG. 19, since a source and drain metal layer (SD) exists in the B area, the signal crosstalk between the touch-control signal trace 131 and the display signal trace may be well shielded. However, due to the limitation of a narrow frame, when some display panels 10 are wired, the lower boundary of a film layer, such as a cathode layer 122 or an anode layer, will not exceed the first boundary D1, that is to say, there is no film layer such as a cathode layer 122 or an anode layer, between the touch-control signal trace 131 in the first trace area D and the display signal trace 121, thus resulting in that the touch-control signal trace 131 cannot be well shielded, and therefore there is a risk of crosstalk between the touch-control signal traces 131.

Therefore, in order to solve the above-mentioned problem of signal crosstalk between a touch-control signal trace 131 and a display signal trace 121 in a first trace area D, the display panel 10 provided in some embodiments of the present disclosure further includes a signal shielding layer 30 between the touch-control signal trace 131 and the display signal trace 121 in a direction perpendicular to the substrate 11, and an orthographic projection of the signal shielding layer 30 onto the substrate 11 at least covers an intersection area where the touch-control signal trace 131 intersects the display signal trace 121 in the first trace area D.

In the above-mentioned solution, by adding a signal shielding layer 30 between the touch-control signal trace 131 and the display signal trace 121, signal crosstalk between the touch-control signal trace 131 and the display signal trace 121 may be reduced, thereby ensuring that the touch function is not affected and improving the working stability and reliability of products.

In some exemplary embodiments, since an insulating layer is provided between the touch-control signal trace 131 and the display signal trace 121 in the peripheral area in the direction perpendicular to the substrate 11 in the stacked structure of the display panel 10, and the touch-control functional layer 13 is provided on the encapsulation layer 15, the insulating layer includes at least one organic insulating layer. The signal shielding layer 30 is located between the organic insulating layer and the touch-control signal trace 131, or located between the organic insulating layer and the display signal trace 121. Since the signal shielding layer 30 needs to cover the first trace area D, a width thereof is relatively large. There is a gas inside the organic insulating layer, in order to avoid "bulging" of the signal shielding layer 30, an opening pattern is provided on the signal shielding layer 30, and orthographic projections of the touch-control signal trace 131 and the opening pattern onto the substrate 11 are at least partially non-overlapping. In this way, the bulging phenomenon may be avoided by providing an opening pattern on the signal shielding layer 30. The orthographic projections of the opening pattern and the touch-control signal trace 131 onto the substrate are at least partially misaligned. For example, the orthographic projections of the touch-control signal trace 131 along the first direction and the opening pattern onto the substrate 11 are not overlapped, so that the position of the opening pattern keeps away from the touch-control signal trace 131, which may effectively avoid the touch-control signal trace 131 interfering with the display signal trace 121 via the opening pattern.

As shown in FIGS. 16 and 17, the opening pattern illustratively includes a plurality of apertures 31. At least one of the apertures 31 is disposed at a gap between at least two adjacent touch-control signal traces 131. That is, at least part of the touch-control signal trace may be disposed between apertures 31. Illustratively, at least one aperture 31 is provided at a gap between any two adjacent touch-control signal traces 131. The density of the apertures 31 may be rationally designed according to the number and spacing of the touch-control signal traces 131, so as to fully ensure that the signals of the touch-control signal traces 131 are not cross-talked. It is of course understood that the specific pattern of the opening pattern is not limited thereto.

It should also be noted that the first trace area D is located between the display area (AA area) and the isolation dam 20, and there is no design such as arranging an opening in a pixel definition layer and arranging a post spacer in the first trace area D. Therefore, the pixel definition layer in the first trace area D is relatively flat, and the risk of broken lines caused by the climbing slope of the signal shielding layer 30 can be mitigated.

In addition, the signal shielding layer 30 may be inputted with a constant-low direct current signal (VSS) or a constant-high direct current signal (VDD), so as to better shield interference signals.

Illustratively, the display unit includes an anode layer 124, an organic electroluminescent layer 123 and a cathode layer 122, the anode layer includes an anode pattern for accessing a display signal, the signal shielding layer 30 is arranged in a same layer and made of a same material as the anode layer 124, and the signal shielding layer 30 is not connected to the anode pattern, and the signal shielding layer 30 accesses a constant-low direct current signal or a constant-high direct current signal.

With the above-mentioned solution, when the anode layer is patterned, the signal shielding layer 30 may be patterned through the same patterning process during formation of the anode pattern, and the structure is simple without additional process steps.

Furthermore, in some embodiments, the peripheral area of the display panel 10 is provided with a cathode lapping pattern, cathodes in the periphery of the cathode layer are electrically connected to each other by being overlapping jointed with the cathode lapping pattern. At least part of the cathode lapping pattern is located in the binding side and at a transition corner area between the binding side and at least another side of the substrate adjacent to the binding side. Taking the embodiment shown in FIG. 17 as an example, in some display panels 10, a part of the cathode lapping pattern 50 is provided in the region E' in the figure, the part of the cathode lapping pattern 50 is provided in the same layer and made of the same material as the anode pattern, the cathode lapping pattern and the anode pattern are insulated from each other, and orthographic projections between the cathode lapping pattern and the anode pattern onto the substrate do not coincide with each other, and a constant-low direct current signal may be inputted to the cathode lapping pattern 50, and an aperture 31 pattern may also be provided on the cathode lapping pattern 50 to avoid the "bulging" phenomenon.

In some embodiments, the cathode lapping pattern 50 and the cathode layer 122 are electrically connected, and orthographic projections of the cathode lapping pattern 50 and the cathode layer 122 onto the substrate 11 are at least partially coincident, and the cathode layer 122 is coupled to a constant-low direct current signal such that the constant-low direct current signal is coupled to the cathode lapping pattern 50, and the signal shielding layer 30 and the cathode lapping pattern 50 are connected as an integrity, thereby to achieve the purpose that the signal shielding layer 30 is coupled to the constant-low direct current signal.

Furthermore, in some embodiments, as shown in FIGS. 16 and 17, a constant-low direct current signal is inputted to the cathode layer 122, an orthographic projection of a boundary at one side of the cathode layer near the isolation dam 20 onto the substrate 11 does not exceed the first boundary D1, the signal shielding layer 30 has a first overlapping area on the side near the first boundary D1 in which the signal shielding layer 30 overlaps the cathode layer 122, and the first overlapping area is electrically connected to the cathode layer 122 through a first via hole.

In the above aspect, the signal shielding layer 30 may directly be lapping jointed to the cathode layer 122 such that a constant-low direct current signal is coupled to both the signal shielding layer 30 and the cathode layer 122.

Furthermore, in some embodiments, it may be that the signal shielding layer 30 is inputted by a constant-low direct current signal from a binding circuit, and then the cathode layer is lapping connected to the signal shielding layer 30, so as to achieve the purpose of the cathode layer accessing a constant-low direct current signal.

It should be noted that in the above-mentioned embodiments, the signal shielding layer 30 and the cathode layer 122 may be inputted with a constant-low direct current signal, and the implementation methods thereof may include the following.

First, the signal shielding layer 30 is directly connected to the cathode lapping pattern 50 as an integral body, so as to achieve the purpose of inputting a constant-low direct current signal to both the signal shielding layer 30 and the cathode layer 122. In this case, one side of the signal shielding layer 30 close to the cathode layer 122 and a first boundary D1 of the cathode layer 122 may be directly overlapped, but are not connected:

Second, the signal shielding layer 30 may overlap and be electrically connected to the first boundary D1 of the cathode layer 122 at one side close to the cathode layer, and the signal shielding layer 30 is not connected to the cathode lapping pattern 50.

Third, the signal shielding layer 30 and the cathode lapping pattern 50 are connected as an integral piece, and a side of the signal shielding layer 30 close to the cathode layer 122 may be overlapped and be electrically connected with the first boundary D1 of the cathode layer 122.

In addition, as shown in FIG. 19, in the first direction X, a plurality of peripheral source and drain metal traces 40 are further provided between the second boundary D2 and the display signal trace 121 and/or between the second boundary D2 and the binding circuit, a constant-low direct current signal is inputted to the peripheral source and drain metal traces 40 (in this case, the peripheral source and drain metal trace 40 may refer to a VSS line located in an area C shown in FIG. 19), and the signal shielding layer 30 has a second overlapping area overlapping with the peripheral source and drain metal traces 40) on a side close to the second boundary D2; and the second overlapping area is electrically connected to the peripheral source and drain metal trace 40 via a second via hole.

In the above-mentioned solution, the peripheral source and drain metal trace 40 may directly access a constant-low direct current signal on the binding circuit, and the signal shielding layer 30 is overlapping jointed to the peripheral source and drain metal trace 40 and the cathode layer, achieving the purpose of accessing a constant-low direct current signal on both the cathode layer and the signal shielding layer 30.

In addition, in the above-mentioned solutions, the signal shielding layers 30 all access a constant-low direct current signal, and in other embodiments, when the signal shielding layers 30 all access a constant-high direct current signal, the peripheral source and drain metal traces 40 may also access a constant-high direct current signal (at this time, the peripheral source and drain metal traces 40 may refer to VDD lines located in an area C as shown in the figure), and the signal shielding layer 30 have a second overlapping area overlapping with the peripheral source and drain metal traces 40 on one side near the second boundary D2; and the second overlapping area is electrically connected to the peripheral source and drain metal traces 40 via a second via hole, thereby achieving the purpose of accessing a VDD signal by the signal shielding layer 30.

It is of course to be understood that the above is only an exemplary embodiment, and in practical applications, particularly the signal shielding layer 30, the way of signal inputting of the cathode layer is not limited thereto.

Furthermore, as seen from a film layer, the display unit includes a first source and drain metal layer, where the first source and drain metal layer includes a source electrode pattern and a drain electrode pattern of a thin-film transistor, and the peripheral source and drain metal trace 40 is arranged in the same layer and made of the same material as the first source and drain metal layer.

It should be noted that the display unit may include a single-layer source and drain metal layer or a double-layer source and drain metal layer, and the first source and drain metal layer may be any source and drain metal layer rationally selected according to the actual product.

It is further noted that the display signal trace 121 may include, for example, a scanning signal line, a light emission control signal line, a reference voltage signal line, etc.

Figure 18:
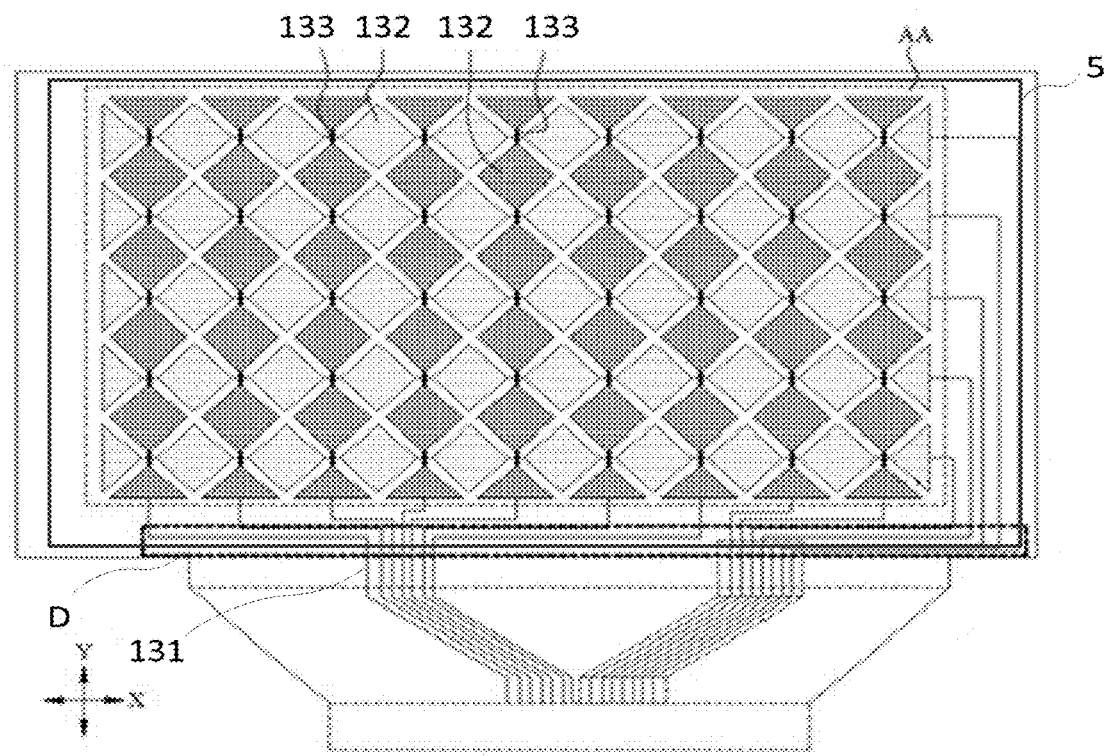
FIG. 18 is a schematic diagram of a touch-control structure of an FMLOC display panel in some embodiments of the present disclosure.

In addition, as shown in FIG. 18, in some embodiments, the touch-control functional layer 13 is a flexible multi-layer screen touch-control structure (FMLOC), the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer 132, and at least another of the touch-control electrode layers is a bridging metal layer 133; the metal mesh layer 132 and the bridging metal layer 133 are connected through a via hole within the insulating layer to form a touch-control electrode in self-capacitance mode.

In other embodiments, when the touch-control functional layer is a flexible multi-layer screen touch-control FMLOC, it may also be that the touch-control pattern includes a plurality of mutual-capacitance touch-control electrodes distributed in an array; a film layer structure of the touch-control functional layer includes at least two touch-control electrode layers and an insulating layer provided between the at least two touch-control electrode layers. At least one of the touch-control electrode layers is a transmission electrode layer; at least another of the touch-control electrode layers is a sensing electrode layer. The transmission electrode layer and the sensing electrode layer are separated by the insulating layer so as to form a mutual-capacitance touch-control electrode. The detailed structure will not be described again here. Furthermore, the touch-control functional layer may also include a protective layer covering one side of at least two touch-control electrode layers facing away from the drive back plate, and the protective layer may have a protective effect on the touch-control electrode layer, and may be an organic material.

In other embodiments, as shown in FIG. 17, the touch-control functional layer 13 may also be a flexible single-layer screen touch FSLOC, a film layer structure of the touch-control functional layer 13 includes a touch-control electrode layer, and a touch-control pattern on the touch-control electrode layer includes a plurality of touch-control electrodes 132 distributed in an array and touch-control signal traces 131 connected to the plurality of touch-control electrodes. The detailed structure will not be described again here. FIG. 19 shows a wiring scheme which may be a FMLOC display panel, where the number of touch-control signal traces 131 thereof is relatively small, the touch-control signal traces 131 thereof may extend in the left and right frame directions via the first trace area D after being led out from a binding circuit, and the signal shielding layer 30 may be provided in the first trace area D.

Figure 20:
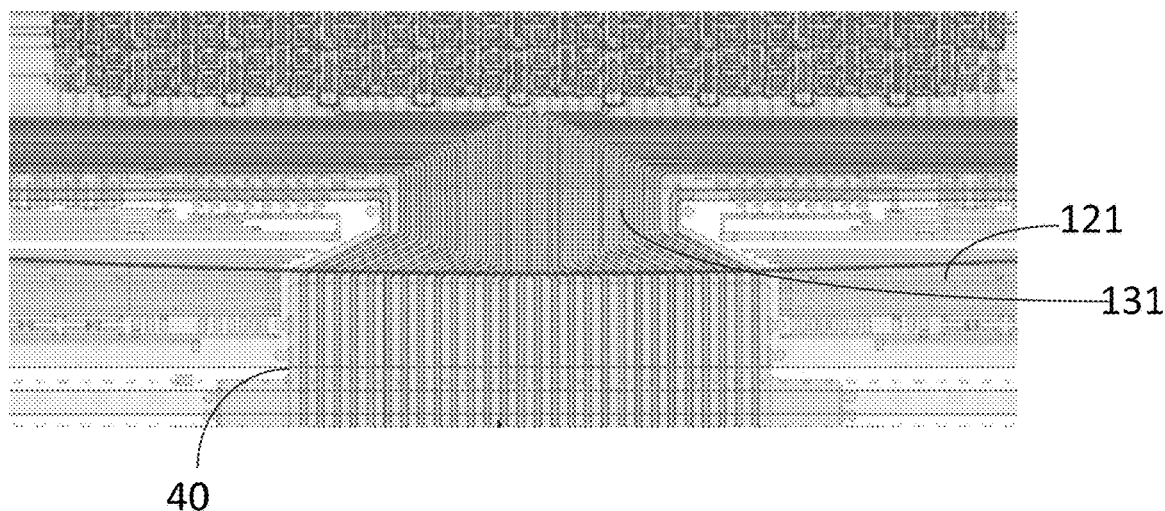
FIG. 20 is a schematic diagram of routing at B1 of FIG. 7 in further embodiments of the present disclosure.
Figure 21:
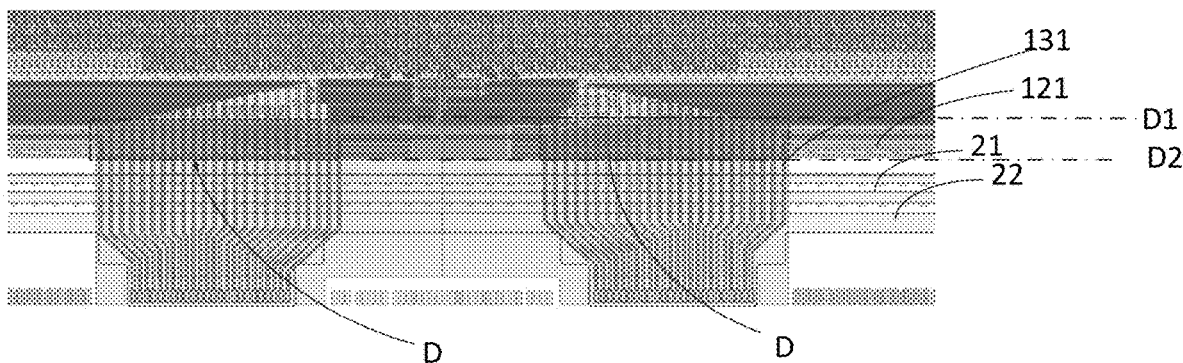
FIG. 21 is a schematic diagram of routing at B1 of FIG. 7 in further embodiments of the present disclosure.

FIG. 20 is a schematic diagram showing the traces of a FSLOC display panel, and FIG. 21 is a schematic diagram showing the traces of another FSLOC display panel 10. In the display panel 10 shown in FIG. 21, the number of the touch-control signal trace traces increase and the lower frame becomes smaller, as compared to the display panel 10 shown in FIG. 18.

Referring to FIG. 20, since the number of the touch-control signal traces 131 is less than a predetermined value, the cathode layer and the source and drain metal layer may completely cover the touch-control signal traces 131 at the regions 1 and 2 shown in FIG. 20. Thus, the signal shielding layer 30 may not be provided.

Referring to FIG. 21, when the number of the touch-control signal traces 131 is greater than a predetermined value and is divided into a plurality of sub-areas in the second direction Y, and the frame in the binding side is reduced to a predetermined width, the signal shielding layer 30 needs to be added between the touch-control signal trace 131 and the display signal trace 121 at the first trace area D, and the signal shielding layer 30 may be inputted with a constant-high direct current signal (VDD).

It may be seen therefrom that the display panel 10 in the embodiments of the present disclosure may be applied to a FMLOC display panel 10, and may also be applied to a FSLOC display panel 10 including touch-control signal traces 131 whose number is greater than a predetermined value.

The predetermined value may be a value empirically obtained according to requirements of actual product performance or the like.

Furthermore, with regard to the isolation dam 20 of the display panel 10, since it is mainly made of an organic layer, in order to prevent the organic layer from forming a water vapour channel, another organic layer, such as an organic insulating layer and a pixel definition layer will be completely removed within a certain range outside the Dam 2 (for example, being greater than 40 μm), between the Dam 1 and the Dam 2 (for example, being equal to 40 μm), and within a certain range inside the Dam 1 (for example, being greater than 40 μm), and thus a large difference between film layer segments will be formed.

Figure 6:
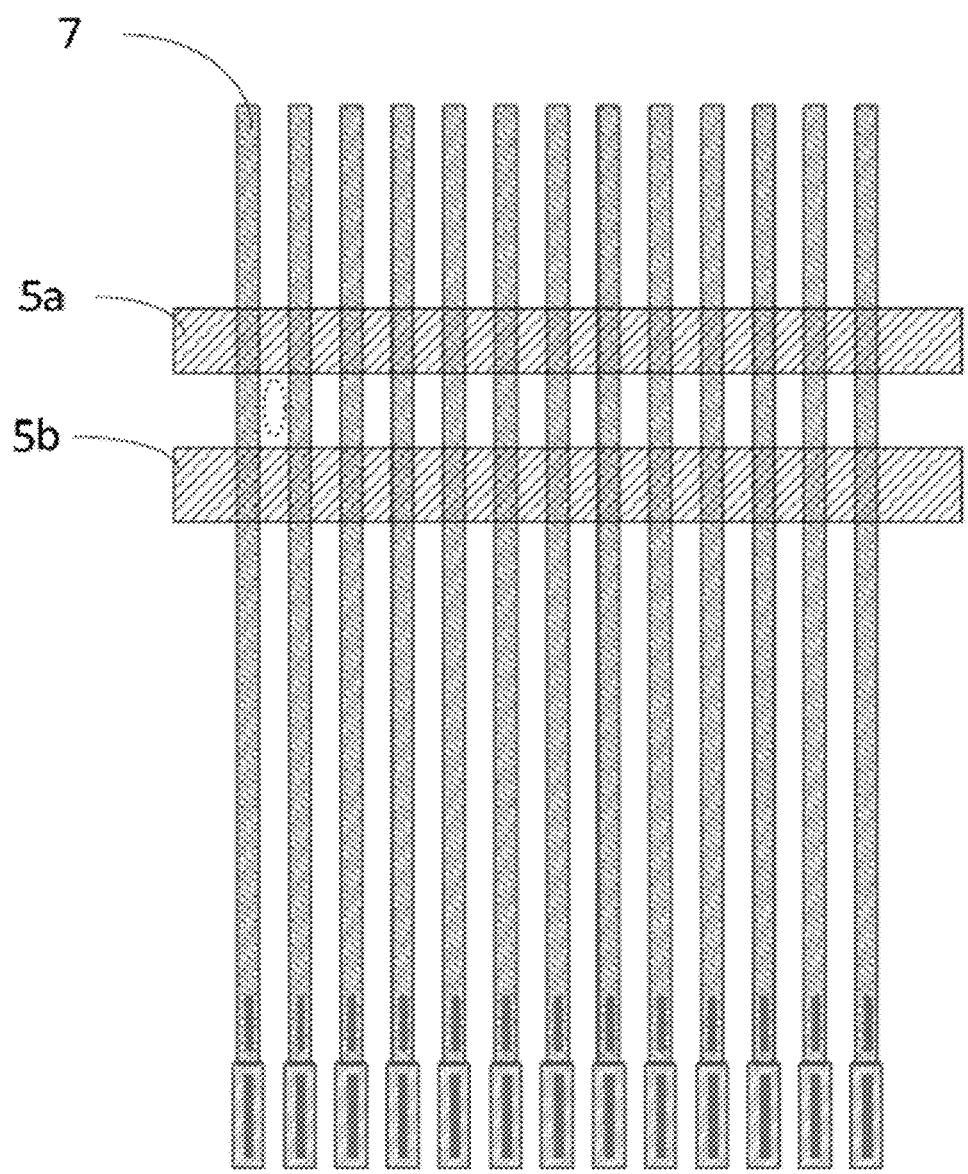
FIG. 6 is a schematic diagram showing the structure of a touch-control signal trace crossing an isolation dam at a dashed box B1 in FIG. 3.

As shown in FIG. 6, at the binding side, the touch-control signal trace 7 needs to cross the isolation dams 5a and 5b, and in order to prevent a large gradient angle of the isolation dams 5a and 5b from causing the broken the touch-control signal trace 7, as shown in FIGS. 4 and 5, the isolation dam 20 at the binding side may thin the thickness of the pixel definition layer 55 and the post spacer 56, for example, as shown in FIGS. 4 and 5, the post spacer 56 is removed from the isolation dam 5 at the binding side, leaving alone the pixel definition layer 55. Since there is a groove structure between the Dam 1 and the Dam 2, when the touch-control signal trace 131 is patterned, it is easy to leave metal residues after exposure and etching processes, resulting in a short circuit between two adjacent traces, as shown in FIG. 6, and it is easy to leave metal residues at the dotted box, resulting in a short circuit.

In order to solve the above-mentioned problems, in some embodiments of the present disclosure, as shown in FIGS. 8 to 16, an end a in the Figures is an end where a touch-control signal trace 131 leads out from a binding circuit, and an end b in the Figures is an end where the touch-control signal trace extends to a display area, at least a plurality of the touch-control signal traces 131 are parallel to each other at a first position where they are leaded out from the binding circuit and the line spacing is a first spacing, and are parallel to each other at a second position where the touch-control signal traces 131 across the isolation dam 20 and the line spacing is a second spacing, and the first spacing is less than the second spacing.

With the above-mentioned solution, the problem of short-circuiting of the touch-control signal traces 131 due to metal residue between the isolation dams 20 may be reduced by enlarging the line spacing of the touch-control signal trace 131 at a position across the isolation dam 20.

Illustratively, at least a plurality of the touch-control signal traces 131 extend in parallel from the first position, then are inclined to a second position in a same direction or in different directions, and finally extend in parallel from the second position.

With the above-mentioned solution, the touch-control signal traces 131 led out from the binding circuit are arranged obliquely and divergently, and routed along the direction perpendicular to the isolation dam 20 at the position close to the isolation dam 20, so that the spacing of the touch-control signal traces 131 at the position across the isolation dam 20 is enlarged, so as to reduce the risk of short-circuiting.

The oblique divergent wiring may include a fixed angle and a non-fixed angle. That is, the touch-control signal traces 131 are inclined at the same angle or inclined at different angles.

FIGS. 8 to 11 each shows a schematic diagram of a wiring structure when a plurality of the touch-control signal traces 131 are inclined at the same angle; FIG. 12 to FIG. 15 each shows a schematic diagram of a wiring structure when a plurality of the touch-control signal traces 131 are inclined at different angles.

It should be noted that, in some embodiments, regardless of whether multiple touch-control signal traces 131 are inclined at the same angle or at different angles, when leading out from the binding circuit, the multiple touch-control signal traces 131 are lead out in parallel and are included in a diverge manner, cross the isolation dam 20 in parallel and extend in a direction perpendicular to the isolation dam 20, and continue to extend in parallel into the display area (AA area).

In addition, in the above-mentioned solution, in order to increase the distance between the touch-control signal traces 131 in a position where it crosses the isolation dam 20, the line spacing is widened by first obliquely diverging arranging the touch-control signal traces 131 led out from the binding circuit, and in other embodiments not shown, the line spacing may also be widened by the touch-control signal trace 131 in a winding design (for example, an arc line design rather than a diagonal line design) according to actual space wiring requirements of a product.

Further, by way of example, as shown in FIGS. 8 and 9, and FIGS. 12 and 13, the touch-control signal traces 131 may be divided into at least one sub-area in the second direction Y only, a plurality of touch-control signal traces 131 near the edge side of the display panel in the second direction Y within each sub-area may be arranged obliquely and divergently, and the touch-control signal traces 131 near the middle position of the display panel in the second direction Y may extend linearly without the inclined wiring.

As shown in FIGS. 10 and 11, and FIGS. 14 and 15, in other embodiments, a plurality of the touch-control signal traces 131 in each of the sub-areas are symmetrically distributed with respect to one of the touch-control signal traces 131 in the middle in the second direction Y, and one of the touch-control signal traces 131 in the middle may extend linearly without inclined wiring.

In addition, embodiments of the present disclosure provide a display panel 10 whose display area (AA area) may be circular, rectangular, or in other shapes.

In addition, embodiments of the present disclosure provide a method for manufacturing the display panel 10, which may include the following steps:

step S01, fabricating a display functional layer 12 on a substrate 11 and performing encapsulation to form an encapsulation layer 15, where the display functional layer 12 includes display units located in the display area (AA area) and a plurality of display signal traces 121 connected to the display units, and an isolation dam 20 arranged around the display area (AA area) is provided in a peripheral area, where at a binding side, a boundary of a side of the display area (AA area) close to the isolation dam 20 is a first boundary D1; a boundary of a side of the isolation dam 20 close to the display area (AA area) is a second boundary D2, a first trace area D is arranged between the second boundary D2 and the first boundary D1, and the display signal trace 121 is arranged along a second direction Y in the first trace area D; and step S02, forming a touch-control functional layer 13 on the encapsulation layer 15, where the touch-control functional layer 13 includes a touch-control pattern located in the display area (AA area) and a plurality of touch-control signal traces 131 located in the peripheral area, the touch-control signal trace 131 is arranged in different layers from the display signal trace 121, and in the first trace area D, the touch-control signal trace 131 is arranged along a first direction X and lead out from the binding circuit and is connected to the touch-control pattern via the isolation dam 20 and the first trace area D sequentially; an orthographic projection of the display signal trace 121 onto the substrate 11 crosses an orthographic projection of the touch-control signal trace 131.

In step S01, the signal shielding layer 30 is formed between the touch-control signal trace 131 and the display signal trace 121 in a direction perpendicular to the substrate 11, and an orthographic projection of the signal shielding layer 30 onto the substrate 11 covers at least the first trace area D.

The above-mentioned step S01 specifically includes: step S011, forming the anode layer and the signal shielding layer 30 of the display units through the same patterning process.

The patterning process may select a conventional anode layer patterning process, for example, including exposure, development, etching and other steps; the specific process thereof is not described in detail, only the pattern of the mask plate needs to be improved in the conventional patterning process, and a corresponding pattern of the signal shielding layer 30 is added on the basis of the original anode pattern.

In addition, embodiments of the present disclosure also provide a display panel 10, which has a display area (AA area) and a peripheral area located at the periphery of the display area (AA area), where at least one side of the peripheral area is a binding side where a binding circuit is arranged, and the peripheral area is provided with an isolation dam 20 arranged around the display area (AA area).

The display panel 10 includes:
a substrate 11;
a display functional layer 12, where the display functional layer 12 includes display units located in the display area (AA area), and display signal traces 121 connected to the display units; and
a touch-control functional layer 13, where the touch-control functional layer 13 includes a touch-control pattern located in the display area (AA area), and touch-control signal traces 131 located in the peripheral area, and the touch-control signal trace 131 and the display signal trace 121 are arranged in different layers.

On the binding side, the touch-control signal trace 131 is arranged along a first direction X, and is led out from the binding circuit and is connected to the touch-control pattern via the isolation dam 20, as shown in FIGS. 8 to 16. In the figure, an end a is one end where the touch-control signal trace 131 is led out from the binding circuit, an end b is one end where the touch-control signal trace extend to the display area, and at least a plurality of the touch-control signal traces 131 are parallel to each other at a first position where the touch-control signal traces are led out from the binding circuit and a line spacing is a first spacing, and the touch-control signal traces 131 are parallel to each other at a second position where the touch-control signal traces across the isolation dam 20 and a line spacing is a second spacing, and the first spacing is smaller than the second spacing.

With the above-mentioned solution, the problem of short-circuiting of the touch-control signal traces 131 due to metal residue between the isolation dams 20 may be reduced by enlarging the line distance of the touch-control signal traces 131 at a position across the isolation dam 20.

Illustratively, orthographic projections of the at least a plurality of the touch-control signal traces onto the substrate are led out in parallel from the first position, then are inclined at a same angle or at different angles to a second position in a same direction or in different directions, and finally extend in parallel from the second position.

With the above-mentioned solution, the touch-control signal traces 131 led out from the binding circuit are routed obliquely and divergently at first, and routed along the direction perpendicular to the isolation dam 20 at the position close to the isolation dam 20, so that the spacing of the touch-control signal traces 131 across the position of the isolation dam 20 is enlarged, so as to reduce the risk of short-circuiting.

The oblique divergent wiring may include a fixed angle and a non-fixed angle. That is, the touch-control signal traces 131 are inclined at the same angle or inclined at different angles.

FIGS. 8 to 11 each shows a schematic diagram of a wiring structure when a plurality of the touch-control signal traces 131 are inclined at the same angle. FIG. 12 to FIG. 15 each shows a schematic diagram of a wiring structure when a plurality of the touch-control signal traces 131 are inclined at different angles.

It should be noted that, in some embodiments, regardless of whether multiple touch-control signal traces 131 are inclined at the same angle or at different angles, when leading out from the binding circuit, the multiple touch-control signal traces 131 are lead out in parallel and are included in a diverge manner, cross the isolation dam 20 in parallel and extend in a direction perpendicular to the isolation dam 20, and continue to extend in parallel into the display area (AA area).

In addition, in the above-mentioned solution, in order to increase the distance between the touch-control signal traces 131 in a position where it crosses the isolation dam 20, the line spacing is widened by first obliquely diverging arranging the touch-control signal traces 131 led out from the binding circuit, and in other embodiments not shown, the line spacing may also be widened by the touch-control signal trace 131 in a winding design (for example, an arc line design rather than a diagonal line design) according to actual space wiring requirements of a product.

Further, by way of example, as shown in FIGS. 8 and 9, and FIGS. 12 and 13, the touch-control signal traces 131 may be divided into at least one sub-area in the second direction Y only, a plurality of touch-control signal traces 131 near the edge side of the display panel in the second direction Y within each sub-area may be arranged obliquely and divergently, and the touch-control signal traces 131 near the middle position of the display panel in the second direction Y may extend linearly without the inclined wiring.

As shown in FIGS. 10 and 11, and FIGS. 14 and 15, in other embodiments, a plurality of the touch-control signal traces 131 in each of the sub-areas are symmetrically distributed with respect to one of the touch-control signal traces 131 in the middle in the second direction Y, and one of the touch-control signal traces 131 in the middle may extend linearly without inclined wiring.

In addition, embodiments of the present disclosure provide a display panel 10 whose display area (AA area) may be circular, rectangular, or in other shapes.

In addition, embodiments of the present disclosure further provide a method for manufacturing the display panel 10, which may include the following steps:

step S01, fabricating a display functional layer 12 on a substrate 11 and performing encapsulation to form an encapsulation layer 15, where the display functional layer 12 includes display units located in the display area (AA area) and a plurality of display signal traces 121 connected to the display units, and an isolation dam 20 arranged around the display area (AA area) is provided in a peripheral area, where at a binding side, a boundary of a side of the display area (AA area) close to the isolation dam 20 is a first boundary D1; a boundary of a side of the isolation dam 20 close to the display area (AA area) is a second boundary D2, a first trace area D is arranged between the second boundary D2 and the first boundary D1, and the display signal trace 121 is arranged along a second direction Y in the first trace area D; and step S02, forming a touch-control functional layer 13 on the encapsulation layer 15, where the touch-control functional layer 13 includes a touch-control pattern located in the display area (AA area) and a plurality of touch-control signal traces 131 located in the peripheral area, the touch-control signal trace 131 is arranged in different layers from the display signal trace 121, and in the first trace area D, the touch-control signal trace 131 is arranged along a first direction X, and is led out from the binding circuit and is connected to the touch-control pattern via the isolation dam 20 and the first trace area D in sequence; an orthographic projection of the display signal trace 121 onto the substrate 11 crosses an orthographic projection of the touch-control signal trace 131.

In step S01, the signal shielding layer 30 is formed between the touch-control signal trace 131 and the display signal trace 121 in a direction perpendicular to the substrate 11, and an orthographic projection of the signal shielding layer 30 onto the substrate 11 covers at least the first trace area D.

Illustratively, orthographic projections of the at least a plurality of the touch-control signal traces onto the substrate are led out in parallel from the first position, then are inclined at a same angle or at different angles to a second position in a same direction or in different directions, and finally extend in parallel from the second position.

With the above-mentioned solution, the touch-control signal traces 131 led out from the binding circuit are routed obliquely and divergently at first, and routed along the direction perpendicular to the isolation dam 20 at the position close to the isolation dam 20, so that the spacing of the touch-control signal traces 131 across the position of the isolation dam 20 is enlarged, so as to reduce the risk of short-circuiting.

The oblique divergent wiring may include a fixed angle and a non-fixed angle. That is, the touch-control signal traces 131 are inclined at the same angle or inclined at different angles.

The figures show a schematic diagram of a wiring structure when a plurality of the touch-control signal traces 131 are inclined at the same angle. The figures show schematic diagrams showing a wiring structure when a plurality of the touch-control signal traces 131 are inclined at different angles.

It should be noted that, in some embodiments, regardless of whether multiple touch-control signal traces 131 are inclined at the same angle or at different angles, when leading out from the binding circuit, the multiple touch-control signal traces 131 are lead out in parallel and are included in a diverge manner, cross the isolation dam 20 in parallel and extend in a direction perpendicular to the isolation dam 20, and continue to extend in parallel into the display area (AA area).

In addition, in the above-mentioned solution, in order to increase the distance between the touch-control signal traces 131 in a position where it crosses the isolation dam 20, the line spacing is widened by first obliquely diverging arranging the touch-control signal traces 131 led out from the binding circuit, and in other embodiments not shown, the line spacing may also be widened by the touch-control signal trace 131 in a winding design (for example, an arc line design rather than a diagonal line design) according to actual space wiring requirements of a product.

Illustratively, the touch-control signal traces 131 are divided into a plurality of sub-areas in the second direction Y, and a plurality of the touch-control signal traces 131 in each of the sub-areas are symmetrically distributed with respect to a center, which is one of the touch-control signal traces 131 in the middle in the second direction Y.

Illustratively, at the binding side, a boundary of a side of the display area (AA area) close to the isolation dam 20 is a first boundary D1, a boundary of a side of the isolation dam 20 close to the display area (AA area) is a second boundary D2, and there is a first trace area D between the second boundary D2 and the first boundary D1.

The display panel 10 further includes a signal shielding layer 30 between the touch-control signal trace 131 and the display signal trace 121 in a direction perpendicular to the substrate 11, and the orthographic projection of the signal shielding layer 30 onto the substrate 11 covers at least the first trace area D.

In some exemplary embodiments, since an insulating layer is provided between the touch-control signal trace 131 and the display signal trace 121 in the peripheral area in the direction perpendicular to the substrate 11 in the stacked structure of the display panel 10, and the touch-control functional layer 13 is provided on the encapsulation layer 15, the insulating layer includes at least one organic insulating layer. The signal shielding layer 30 is located between the organic insulating layer and the touch-control signal trace 131, or located between the organic insulating layer and the display signal trace 121. Since the signal shielding layer 30 needs to cover the first trace area D, a width thereof is relatively large. There is a gas inside the organic insulating layer, in order to avoid "bulging" of the signal shielding layer 30, an opening pattern is provided on the signal shielding layer 30, and orthographic projections of the touch-control signal trace 131 and the opening pattern onto the substrate 11 are at least partially non-overlapping. In this way, by opening an opening pattern on the signal shielding layer 30, a bulging phenomenon may be avoided, and the position of the opening pattern keeps away from the touch-control signal trace 131, so that the touch-control signal trace 131 may be effectively prevented from interfering with the display signal trace 121 through the opening pattern.

As shown in FIG. 5, the opening pattern includes a plurality of apertures 31, at least one of the apertures is provided at a gap between any two adjacent touch-control signal traces 131. That is, the touch-control signal trace 131 is disposed between the apertures 31. The density of the apertures 31 may be rationally designed according to the number and spacing of the touch-control signal traces 131, so as to fully ensure that the signals of the touch-control signal traces 131 are not cross-talked. It is of course understood that the specific pattern of the opening pattern is not limited thereto.

It should also be noted that the first trace area D is located between the display area (AA area) and the isolation dam 20, and there is no design such as arranging an opening in a pixel definition layer and arranging a post spacer in the first trace area D. Therefore, the pixel definition layer in the first trace area D is relatively flat, and the risk of broken lines caused by the climbing slope of the signal shielding layer 30 can be mitigated.

In addition, as shown in FIG. 16, a virtual touch-control signal trace 60 is further provided on the binding side as shown by a dotted box D' in FIG. 16, and the signal shielding layer may not be provided between the virtual touch-control signal trace 60 and the display signal trace 121.

In addition, the signal shielding layer 30 may be inputted with a constant-low direct current signal (VSS) or a constant-high direct current signal (VDD) to better shield interference signals.

Illustratively, the display unit includes an anode layer, an organic electroluminescent layer and a cathode layer.

The anode layer includes an anode pattern for accessing a display signal, the signal shielding layer 30 is arranged on the same layer and made of the same material as the anode layer 124, there is no connection between the signal shielding layer 30 and the anode pattern, and the signal shielding layer 30 is inputted with a constant-low direct current signal or a constant-high direct current signal.

With the above-mentioned solution, when the anode layer is patterned, the signal shielding layer 30 may be patterned by the same patterning process during formation of the anode pattern, and the structure is simple without additional process steps.

Furthermore, in some embodiments, the peripheral area of the display panel 10 is provided with a cathode lapping pattern, cathodes in the periphery of the cathode layer are electrically connected to each other by being overlapping jointed with the cathode lapping pattern. At least part of the cathode lapping pattern is located in the binding side and at a transition corner area between the binding side and at least another side of the substrate adjacent to the binding side. Taking the embodiment shown in FIG. 17 as an example, in some display panels 10, a part of the cathode lapping pattern 50 is provided in the region E' in the figure, the part of the cathode lapping pattern 50 is provided in the same layer and made of the same material as the anode pattern, the cathode lapping pattern and the anode pattern are insulated from each other, and orthographic projections between the cathode lapping pattern and the anode pattern onto the substrate do not coincide with each other, and a constant-low direct current signal may be inputted to the cathode lapping pattern 50, and an aperture 31 pattern may also be provided on the cathode lapping pattern 50 to avoid the "bulging" phenomenon.

In some embodiments, the cathode lapping pattern 50) and the cathode layer 122 are electrically connected, and orthographic projections of the cathode lapping pattern 50 and the cathode layer 122 onto the substrate 11 are at least partially coincident, and the cathode layer 122 is coupled to a constant-low direct current signal such that the constant-low direct current signal is coupled to the cathode lapping pattern 50, and the signal shielding layer 30 and the cathode lapping pattern 50) are connected as an integrity, thereby to achieve the purpose that the signal shielding layer 30 is coupled to the constant-low direct current signal.

Furthermore, in some embodiments, as shown in FIGS. 16 and 17, a constant-low direct current signal is inputted to the cathode layer 122, an orthographic projection of a boundary at one side of the cathode layer near the isolation dam 20 onto the substrate 11 does not exceed the first boundary D1, the signal shielding layer 30 has a first overlapping area on the side near the first boundary D1 in which the signal shielding layer 30 overlaps the cathode layer 122, and the first overlapping area is electrically connected to the cathode layer 122 through a first via hole.

In the above aspect, the signal shielding layer 30 may directly be lapping jointed to the cathode layer 122 such that a constant-low direct current signal is coupled to both the signal shielding layer 30 and the cathode layer 122.

Furthermore, in some embodiments, it may be that the signal shielding layer 30 is inputted by a constant-low direct current signal from a binding circuit, and then the cathode layer is lapping connected to the signal shielding layer 30, so as to achieve the purpose of the cathode layer accessing a constant-low direct current signal.

It should be noted that in the above-mentioned embodiments, the signal shielding layer 30 and the cathode layer 122 may be inputted with a constant-low direct current signal, and the implementation methods thereof may include the following.

First, the signal shielding layer 30 is directly connected to the cathode lapping pattern 50 as an integral body, so as to achieve the purpose of inputting a constant-low direct current signal to both the signal shielding layer 30 and the cathode layer 122. In this case, one side of the signal shielding layer 30 close to the cathode layer 122 and a first boundary D1 of the cathode layer 122 may be directly overlapped, but are not connected:

Second, the signal shielding layer 30 may overlap and be electrically connected to the first boundary D1 of the cathode layer 122 at one side close to the cathode layer, and the signal shielding layer 30 is not connected to the cathode lapping pattern 50.

Third, the signal shielding layer 30 and the cathode lapping pattern 50 are connected as an integral piece, and a side of the signal shielding layer 30 close to the cathode layer 122 may be overlapped and be electrically connected with the first boundary D1 of the cathode layer 122.

In addition, as shown in FIG. 19, in the first direction X, a plurality of peripheral source and drain metal traces 40 are further provided between the second boundary D2 and the display signal trace 121 and/or between the second boundary D2 and the binding circuit, a constant-low direct current signal is inputted to the peripheral source and drain metal traces 40 (in this case, the peripheral source and drain metal trace 40 may refer to a VSS line located in an area C shown in FIG. 19), and the signal shielding layer 30 has a second overlapping area overlapping with the peripheral source and drain metal traces 40 on a side close to the second boundary D2; and the second overlapping area is electrically connected to the peripheral source and drain metal trace 40 via a second via hole.

In the above-mentioned solution, the peripheral source and drain metal trace 40 may directly access a constant-low direct current signal on the binding circuit, and the signal shielding layer 30 is overlapping jointed to the peripheral source and drain metal trace 40 and the cathode layer, achieving the purpose of accessing a constant-low direct current signal on both the cathode layer and the signal shielding layer 30.

In addition, in the above-mentioned solutions, the signal shielding layers 30 all access a constant-low direct current signal, and in other embodiments, when the signal shielding layers 30 all access a constant-high direct current signal, the peripheral source and drain metal traces 40 may also access a constant-high direct current signal (at this time, the peripheral source and drain metal traces 40 may refer to VDD lines located in an area C as shown in the figure), and the signal shielding layer 30 have a second overlapping area overlapping with the peripheral source and drain metal traces 40 on one side near the second boundary D2; and the second overlapping area is electrically connected to the peripheral source and drain metal traces 40 via a second via hole, thereby achieving the purpose of accessing a VDD signal by the signal shielding layer 30.

It is of course to be understood that the above is only an exemplary embodiment, and in practical applications, particularly the signal shielding layer 30, the way of signal inputting of the cathode layer is not limited thereto.

Furthermore, as seen from a film layer, the display unit includes a first source and drain metal layer, where the first source and drain metal layer includes a source electrode pattern and a drain electrode pattern of a thin-film transistor, and the peripheral source and drain metal trace 40 is arranged in the same layer and made of the same material as the first source and drain metal layer.

It should be noted that the display unit may include a single-layer source and drain metal layer or a double-layer source and drain metal layer, and the first source and drain metal layer may be any source and drain metal layer rationally selected according to the actual product.

It is further noted that the display signal trace 121 may include, for example, a scanning signal line, a light emission control signal line, a reference voltage signal line, etc. In addition, in some embodiments, the touch-control functional layer 13 is a flexible multi-layer screen touch-control structure (FMLOC), the touch-control pattern includes a plurality of self-capacitance touch-control electrodes distributed in an array, a film layer structure of the touch-control functional layer includes at least two touch-control electrode layers and an insulating layer provided between the at least two touch-control electrode layers, at least one of the touch-control electrode layers is a metal mesh layer 132, and at least another of the touch-control electrode layers is a bridging metal layer 133; the metal mesh layer 132 and the bridging metal layer 133 are connected through a via hole within the insulating layer to form a touch-control electrode in self-capacitance mode.

In other embodiments, when the touch-control functional layer is a flexible multi-layer screen touch-control FMLOC, it may also be that the touch-control pattern includes a plurality of mutual-capacitance touch-control electrodes distributed in an array; a film layer structure of the touch-control functional layer includes at least two touch-control electrode layers and an insulating layer provided between the at least two touch-control electrode layers. At least one of the touch-control electrode layers is a transmission electrode layer; at least another of the touch-control electrode layers is a sensing electrode layer. The transmission electrode layer and the sensing electrode layer are separated by the insulating layer so as to form a mutual-capacitance touch-control electrode. The detailed structure will not be described again here. Furthermore, the touch-control functional layer may also include a protective layer covering one side of at least two touch-control electrode layers facing away from the drive back plate, and the protective layer may have a protective effect on the touch-control electrode layer, and may be an organic material.

In other embodiments, the touch-control functional layer may also be a flexible single-layer screen touch FSLOC, a film layer structure of the touch-control functional layer includes a touch-control electrode layer, and a touch-control pattern on the touch-control electrode layer includes a plurality of touch-control electrodes distributed in an array and touch-control signal traces connected to the plurality of touch-control electrodes. The detailed structure will not be described again herein.

In addition, FIG. 17 may show a routing scheme of a FMLOC display panel 10, where the number of the touch-control signal traces 131 thereof is relatively small, the touch-control signal traces 131 thereof may extend in the left and right frame directions via the first trace area D after being led out from a binding circuit, and the signal shielding layer 30 may be provided in the first trace area D.

FIG. 18 is a schematic diagram showing traces of a FSLOC display panel 10, and FIG. 19 is a schematic diagram showing traces of another FSLOC display panel 10. In the display panel 10 shown in FIG. 19, the number of the touch-control signal trace traces increase and the lower frame becomes smaller, as compared to the display panel 10 shown in FIG. 18.

Referring to FIG. 18, since the number of the touch-control signal traces 131 is less than a predetermined value, the cathode layer and the source and drain metal layer may completely cover the touch-control signal traces 131 at the regions 1 and 2 shown in FIG. 20. Thus, the signal shielding layer 30 may not be provided.

Referring to FIG. 19, when the number of the touch-control signal traces 131 is greater than a predetermined value and is divided into a plurality of sub-areas in the second direction Y, and the frame in the binding side is reduced to a predetermined width, the signal shielding layer 30 needs to be added between the touch-control signal trace 131 and the display signal trace 121 at the first trace area D, and the signal shielding layer 30 may be inputted with a constant-high direct current signal (VDD).

It may be seen therefrom that the display panel 10 in the embodiments of the present disclosure may be applied to a FMLOC display panel 10, and may also be applied to a FSLOC display panel 10 with the number of touch-control signal traces 131 being greater than a predetermined value.

In addition, the manufacturing method of the display panel 10 provided by embodiments of the present disclosure may include the following steps:

step S01, fabricating a display functional layer 12 on a substrate 11 and performing encapsulation to form an encapsulation layer 15, where the display functional layer 12 includes display units located in the display area (AA area) and a plurality of display signal traces 121 connected to the display units, and an isolation dam 20 arranged around the display area (AA area) is provided in a peripheral area, where at a binding side, a boundary of a side of the display area (AA area) close to the isolation dam 20 is a first boundary D1; a boundary of a side of the isolation dam 20 close to the display area (AA area) is a second boundary D2, a first trace area D is arranged between the second boundary D2 and the first boundary D1, and the display signal trace 121 is arranged along a second direction Y in the first trace area D; and step S02, forming a touch-control functional layer 13 on the encapsulation layer 15, where the touch-control functional layer 13 includes a touch-control pattern located in the display area (AA area), and a plurality of touch-control signal traces 131 located in the peripheral area, the touch-control signal trace 131 are arranged in different layers from the display signal trace 121; at the binding side, the touch-control signal trace 131 is arranged along a first direction X and lead out from the binding circuit and is connected to the touch-control pattern via the isolation dam 20, and at least a plurality of the touch-control signal traces 131 are parallel to each other at a first position where the touch-control signal traces are led out from the binding circuit and a line spacing is a first spacing, and the touch-control signal traces 131 are parallel to each other at a second position where the touch-control signal traces across the isolation dam 20 and a line spacing is a second spacing, and the first spacing is smaller than the second spacing.

The above-mentioned step S01 specifically includes: step S011', a signal shielding layer 30 is formed between the touch-control signal trace 131 and the display signal trace 121 in a direction perpendicular to the substrate 11, and an orthographic projection of the signal shielding layer 30 onto the substrate 11 covers at least the first trace area D.

In step S011', the same patterning process may be used to form the anode layer and the signal shielding layer 30 in the display units.

The patterning process may select a conventional anode layer patterning process, for example, including exposure, development, etching and other steps; the specific process thereof is not described in detail, only the pattern of the mask plate needs to be improved in the conventional patterning process, and a corresponding pattern of the signal shielding layer 30 is added on the basis of the original anode pattern.

The following points need to be explained:

(1) The drawings relate only to the structures involved in the embodiments of the present disclosure, and other structures may refer to general designs.

(2) In the drawings used to describe embodiments of the present disclosure, the thickness of a layer or a region is enlarged or reduced for clarity, i.e., the drawings are not drawn to the actual scale. It will be understood that when an element such as a layer, film, region or substrate is referred to as being "on" or "under" another element, it may be "directly on" or "directly under" the other element or intervening elements may be present.

(3) Without conflict, embodiments of the present disclosure and features of the embodiments may be combined with each other to obtain new embodiments.

The foregoing embodiments are just particular embodiments of the present disclosure, but the scope of the present disclosure is not limited thereto. The scope of the disclosure is defined by the appended claims.

What is claimed is:

1. A display panel, comprising a display area and a peripheral area located at the periphery of the display area, wherein at least one side of the peripheral area is a binding side connected with a binding circuit, and the peripheral area is provided with an isolation dam arranged at least partially around the display area;
    the display panel comprises:
    a substrate;
    a display functional layer, wherein the display functional layer comprises display units located in the display area, and a plurality of display signal traces that are located in at least part of the peripheral area and are connected with the display units; and
    a touch-control functional layer, wherein the touch-control functional layer comprises a touch-control pattern located in the display area, and a plurality of touch-control signal traces located in at least part of the peripheral area, and the touch-control signal trace and the display signal trace are arranged in different layers;
    wherein on the binding side, there are a first boundary and a second boundary arranged opposite to each other, and a first trace area located between the first boundary and the second boundary, and the first boundary is closer to the display area than the second boundary;
    in the first trace area, the touch-control signal trace is arranged along a first direction and are led out from the binding circuit and connected to the touch-control pattern via the isolation dam and the first trace area in sequence, the display signal trace is arranged along a second direction intersecting with the first direction, and there is an intersection area between orthographic projections of the display signal trace and the touch-control signal trace onto the substrate;
    wherein the display panel further comprises a signal shielding layer between the touch-control signal traces and the display signal traces in a direction perpendicular to the substrate, and an orthographic projection of the signal shielding layer onto the substrate at least partially covers the intersection area of the touch-control signal trace and the display signal trace within the first trace area.

2. The display panel according to claim 1, wherein an opening pattern is provided on the signal shielding layer, and an orthographic projection of the touch-control signal trace onto the substrate at least partially does not coincide with an orthographic projection of the opening pattern onto the substrate.

3. The display panel according to claim 2, wherein an orthographic projection of the touch-control signal trace along the first direction onto the substrate does not coincide with the orthographic projection of the opening pattern onto the substrate.

4. The display panel according to claim 3, wherein the opening pattern comprises a plurality of apertures, and at least one of the apertures is provided at a gap between at least two adjacent touch-control signal traces.

5. The display panel according to claim 1, wherein the display units comprise an anode layer, an organic electroluminescent layer and a cathode layer, wherein the anode layer comprises an anode pattern for accessing a display signal, the signal shielding layer is arranged in a same layer and made of a same material as the anode pattern, the signal shielding layer is not connected to the anode pattern, and the signal shielding layer is configured to access a constant-low direct current signal or a constant-high direct current signal.

6. The display panel according to claim 5, wherein the display panel further comprises: a cathode lapping pattern that is arranged on the same layer and made of the same material as the anode pattern, wherein an orthographic projection of the cathode lapping pattern onto the substrate do not coincide with an orthographic projection of the anode pattern onto the substrate, the cathode lapping pattern and the anode pattern are insulated from each other, the orthographic projection of the cathode lapping pattern onto the substrate at least partially coincides with an orthographic projection of the cathode layer onto the substrate, the cathode lapping pattern is electrically connected with the cathode layer, the cathode layer is inputted with the constant-low direct current signal, and the signal shielding layer and the cathode lapping pattern are connected as one body; and/or
    the cathode layer is inputted with the constant-low direct current signal, an orthographic projection of a boundary of the cathode layer on a side near the isolation dam onto the substrate does not exceed the first boundary, the signal shielding layer has a first overlapping area on a side near the first boundary where the signal shielding layer overlaps with the cathode layer, and the first overlapping area is electrically connected to the cathode layer via a first via hole.

7. The display panel according to claim 6, wherein at least part of the cathode lapping pattern is located on the binding side, and is located in a transition corner area between the binding side and at least another side of the substrate that is adjacent to the binding side.

8. The display panel according to claim 5, wherein the display panel further comprises an encapsulation layer configured to encapsulate the display functional layer, and the touch-control functional layer is directly arranged on a side of the encapsulation layer away from the substrate;
    the touch-control functional layer is a touch-control structure on a flexible multi-layer screen, the touch-control pattern comprises a plurality of self-capacitance touch-control electrodes distributed in an array, a film layer structure of the touch-control functional layer comprises at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form the self-capacitance touch-control electrodes; or the touch-control functional layer is a touch-control structure on a flexible multi-layer screen, the touch-control pattern comprises a plurality of mutual-capacitance touch-control electrodes distributed in an array, a film layer structure of the touch-control functional layer comprises at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form the mutual-capacitance touch-control electrodes.

9. The display panel according to claim 5, wherein in the first direction, a plurality of peripheral source and drain metal traces are further provided between the second boundary and the display signal traces and/or between the second boundary and the binding circuit, the peripheral source and drain metal trace is inputted with a constant-low direct current signal or a constant-high direct current signal, the signal shielding layer has a second overlapping area on a side close to the second boundary where the signal shielding layer overlaps with the peripheral source and drain metal trace, and the second overlapping area is electrically connected to the peripheral source and drain metal trace via a second via hole.

10. The display panel according to claim 9, wherein the display units further comprise a first source and drain metal layer, and the first source and drain metal layer comprises source electrode and drain electrode patterns of a thin-film transistor, wherein the peripheral source and drain metal traces are arranged in a same layer and made of a same material as the first source and drain metal layer.

11. The display panel according to claim 10, wherein the touch-control functional layer is a touch-control structure on a flexible multi-layer screen, the touch-control pattern comprises a plurality of self-capacitance touch-control electrodes distributed in an array, a film layer structure of the touch-control functional layer comprises at least two touch-control electrode layers and an insulating layer provided between the at least two touch-control electrode layers, at least one of the touch-control electrode layers is a metal mesh layer, at least another of the touch-control electrode layers is a bridging metal layer, the metal mesh layer and the bridging metal layer are connected via a via hole in the insulating layer so as to form a self-capacitance touch-control electrode; or the touch-control functional layer is a touch-control structure on a flexible multi-layer screen, the touch-control pattern comprises a plurality of mutual-capacitance touch-control electrodes distributed in an array, a film layer structure of the touch-control functional layer comprises at least two touch-control electrode layers and an insulating layer provided between the at least two touch-control electrode layers, at least one of the touch-control electrode layers is an transmission electrode layer, at least another of the touch-control electrode layers is an sensing electrode layer, and the emission electrode layer and the sensing electrode layer are separated by the insulating layer so as to form a mutual-capacitance touch-control electrode; or the touch-control functional layer is a touch-control structure on a flexible single-layer screen, a film layer structure of the touch-control functional layer comprises a touch-control electrode layer, and a touch-control pattern on the touch-control electrode layer comprises a plurality of touch-control electrodes distributed in an array and touch-control signal traces connected to the plurality of touch-control electrodes.

12. The display panel according to claim 1, wherein at least a plurality of the touch-control signal traces are parallel to each other at a first position where the touch-control signal traces are led out from the binding circuit and a line spacing is a first spacing, and the touch-control signal traces are parallel to each other at a second position where the touch-control signal traces across the isolation dam and a line spacing is a second spacing, and the first spacing is smaller than the second spacing.

13. The display panel according to claim 12, wherein orthographic projections of the at least a plurality of the touch-control signal traces onto the substrate are led out in parallel from the first position, then are inclined at a same angle or at different angles to a second position in a same direction or in different directions, and finally extend in parallel from the second position.

14. The display panel according to claim 13, wherein the touch-control signal traces are divided into a plurality of sub-areas in the second direction, and a plurality touch-control signal traces in each of the sub-areas are symmetrically distributed with respect to a center being one of the touch-control signal traces in the middle in the second direction.

15. A display panel, comprising a display area and a peripheral area located at the periphery of the display area, wherein at least one side of the peripheral area is a binding side connected with a binding circuit, and the peripheral area is provided with an isolation dam arranged at least partially around the display area;

the display panel comprises:
  a substrate;
  a display functional layer, wherein the display functional layer comprises display units located in the display area, and display signal traces that are located in at least part of the peripheral area and connected to the display units; and
  a touch-control functional layer, wherein the touch-control functional layer comprises a touch-control pattern located in the display area, and touch-control signal traces located in at least part of the peripheral area, the touch-control signal trace and the display signal trace are arranged in different layers;
wherein on the binding side, the touch-control signal trace is arranged along a first direction, and is led out from the binding circuit and connected to the touch-control pattern via the isolation dam, at least a plurality of the touch-control signal traces are parallel to each other at a first position where the touch-control signal traces are led out from the binding circuit and a line spacing is a first spacing;
the touch-control signal traces are parallel to each other at a second position where the touch-control signal traces across the isolation dam and a line spacing is a second spacing, and the first spacing is smaller than the second spacing;
wherein on the binding side, a boundary of a side of the display area close to the isolation dam is a first boundary, a boundary of a side of the isolation dam close to the display area is a second boundary, and there is a first trace area between the second boundary and the first boundary;
in the first trace area, the touch-control signal trace is arranged along a first direction and are led out from the binding circuit and connected to the touch-control pattern via the isolation dam and the first trace area in sequence, the display signal trace is arranged along a second direction intersecting with the first direction, and there is an intersection area between orthographic projections of the display signal trace and the touch-control signal trace onto the substrate; and wherein the display panel further comprises a signal shielding layer between the touch-control signal traces and the display signal traces in a direction perpendicular to the substrate, and an orthographic projection of the signal shielding layer onto the substrate at least partially covers the intersection area of the touch-control signal trace and the display signal trace within the first trace area.

16. The display panel according to claim 15, wherein orthographic projections of the at least a plurality of the touch-control signal traces onto the substrate are led out in parallel from the first position, then are inclined at a same angle or at different angles to a second position in a same direction or in different directions, and finally extend in parallel from the second position.

17. The display panel according to claim 16, wherein the touch-control signal traces are divided into a plurality of sub-areas in the second direction, and a plurality touch-control signal traces in each of the sub-areas are symmetrically distributed with respect to a center being one of the touch-control signal traces in the middle in the second direction.

18. The display panel according to claim 15, wherein an opening pattern is provided on the signal shielding layer, and an orthographic projection of the touch-control signal trace onto the substrate at least partially does not coincide with an orthographic projection of the opening pattern onto the substrate.

19. A display device, comprising the display panel according to claim 1.

* * * * *